(12) United States Patent
Mercier

(10) Patent No.: US 6,590,788 B2
(45) Date of Patent: Jul. 8, 2003

(54) INTRINSICALLY SAFE UNIVERSAL SWITCHING POWER SUPPLY

(75) Inventor: Claude Mercier, Peterborough (CA)

(73) Assignee: Milltronics Ltd., Ontario (CA)

( * ) Notice: Subject to any disclaimer, the term of this patent is extended or adjusted under 35 U.S.C. 154(b) by 0 days.

(21) Appl. No.: 10/046,432

(22) Filed: Jan. 14, 2002

(65) Prior Publication Data

US 2002/0154520 A1 Oct. 24, 2002

Related U.S. Application Data

(63) Continuation of application No. PCT/CA00/00832, filed on Jul. 14, 2000.

(30) Foreign Application Priority Data

Jul. 14, 1999 (CA) .............................................. 2277686

(51) Int. Cl.[7] .................... H02M 3/335; H02H 7/122
(52) U.S. Cl. ........................ 363/21.06; 363/21.07; 363/56.01; 363/97; 363/56.12
(58) Field of Search .................... 363/21.04, 21.05, 363/21.06, 21.07, 55, 56.01, 56.09, 56.1, 56.11, 56.12, 95, 97

(56) References Cited

U.S. PATENT DOCUMENTS

| | | | | |
|---|---|---|---|---|
| 4,646,219 A | * | 2/1987 | Rohl .......................... 361/18 |
| 5,050,060 A | * | 9/1991 | Geuns ........................ 361/111 |
| 5,301,082 A | * | 4/1994 | Stolarczyk et al. ......... 361/106 |
| 5,515,257 A | | 5/1996 | Ishii ............................ 363/21 |
| 5,528,481 A | | 6/1996 | Caldeira et al. .............. 363/20 |
| 5,694,283 A | * | 12/1997 | Huczko ....................... 361/115 |
| 5,907,292 A | * | 5/1999 | Ahr ........................ 340/870.31 |
| 5,982,594 A | * | 11/1999 | Huczko ...................... 361/100 |
| 6,069,802 A | * | 5/2000 | Priegnitz .................... 323/907 |

FOREIGN PATENT DOCUMENTS

| JP | 7-15954 | 1/1995 | ............ H02M/3/28 |
|---|---|---|---|
| JP | 9-182425 | 7/1997 | ............ H02M/3/28 |
| WO | 97-45946 | 12/1997 | .......... H02M/3/155 |

* cited by examiner

Primary Examiner—Bao Q. Vu
(74) Attorney, Agent, or Firm—Harness Dickey & Pierce P.L.C.

(57) ABSTRACT

A universal switching power supply for generating one or more output voltage levels wherein the power supply is operable over a range of AC and DC input supply voltages. The universal switching power supply achieves a ratio between the highest voltage and lowest voltage of at least 27. The universal switching power supply also features an intrinsically safe output. The intrinsically safe output circuitry comprises a multi-layer PCB with a planar core transformer.

22 Claims, 21 Drawing Sheets

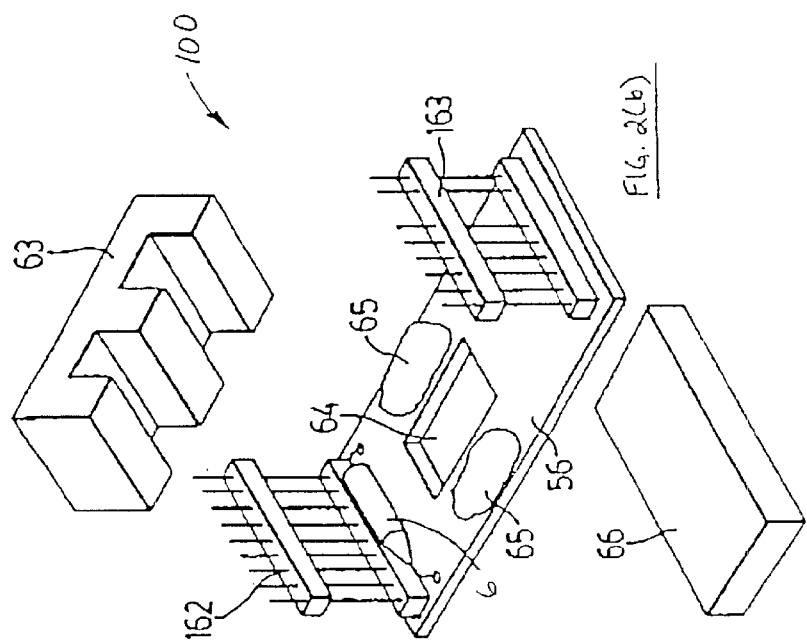
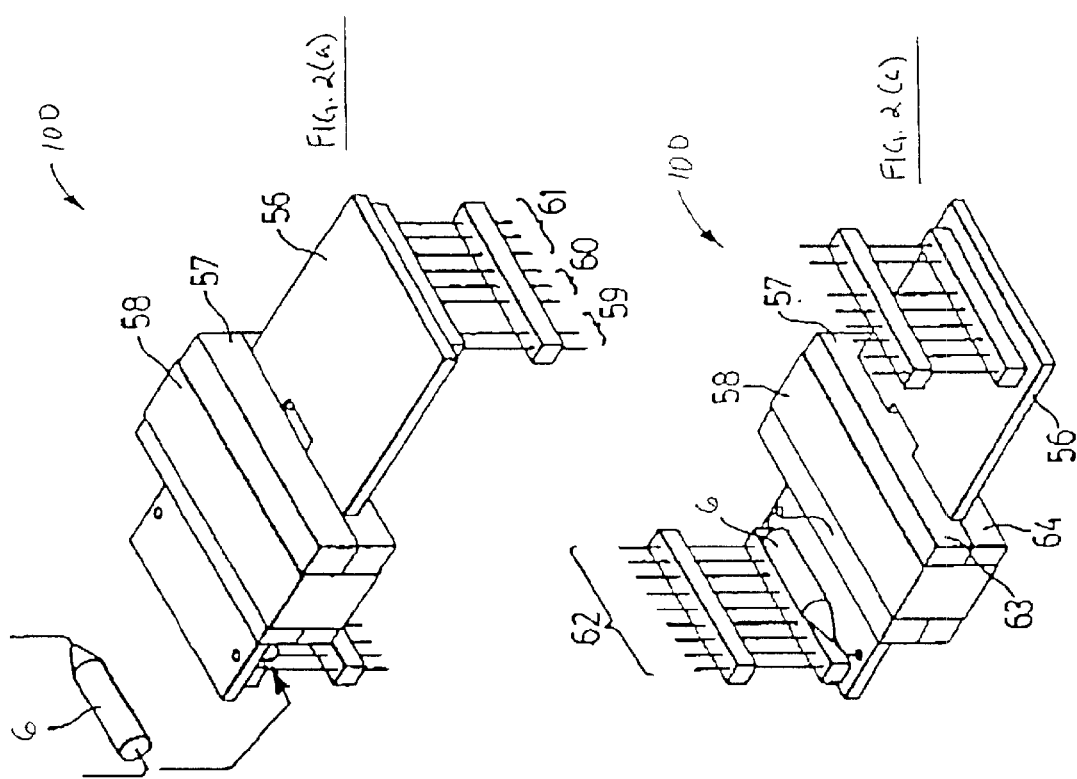

| | |
|---|---|
| TOTAL INSULATION = | 0.0977" (2.48158 mm) |
| 2 x 2 Oz COPPER LAYERS = | 0.0056" (0.14224 mm) |
| 6 x 1 Oz COPPER LAYERS = | 0.0084" (0.21336 mm) |
| 2 x 1/2 Oz COPPER LAYER = | 0.0014" (0.03556 mm) |
| 2 x 1/2 Oz TIN PLATING = | 0.0014" (0.03556 mm) |
| TOTAL THICKNESS | 0.1145" (2.9083 mm) +/- 10% |
| CORE AREA THICKNESS (WITHOUT TOP & BOTTOM PLATED COPPER) | 0.1103" (2.8016 mm) +/- 10% |

LAYER 4

LAYER 5

LAYER 6

LAYER 8

LAYER 9

LAYER 10

INTRINSICALLY SAFE UNIVERSAL SWITCHING POWER SUPPLY

This application is a continuation of International Patent Application No. PCT/CA00/00832 filed Jul. 14, 2000.

FIELD OF THE INVENTION

The present invention relates to universal switching power supplies, and more specifically to intrinsically safe universal switching power supplies. Intrinsically safe power supplies are particularly useful in petroleum and chemical industries.

BACKGROUND OF THE INVENTION

Switching power supplies are commonly used throughout the world in computers and many other apparatus. They are used because, for the same output power, they are much smaller and lighter. Switching power supplies also provide a good regulation of the outputs over a wide range of input voltages. Isolated 90 to 250 Vac switching power supplies are quite common in the art. Isolated DC to DC switching power supplies with an input voltage range of 9 to 35 V are also quite common in the art.

Around the world, there are many voltage standards employed for powering electrical equipment. For instance, there are 9 Vac/Vdc, 12 Vac/Vdc, 24 Vac/Vdc, 48 Vdc/Vac, 90–250 Vac and some 129 Vdc standards. In addition, there are probably many other very special cases used around the world. There remains a need for a universal power supply that handles 9–250 Vac and Vdc.

In some chemical and petroleum industries, there is a need for a very high level of safety to make sure that the output is well isolated and won't create any risk of flame, explosion or shock hazard. Power supplies of this type are commonly referred to as intrinsically safe (I.S.) power supplies. In fact, most of the time, only one of the power supply outputs is considered I.S.

To build an I.S. transformer, the transformer must have a large spacing with redundant protections to allow two faults anytime and anywhere in the power supply electronic circuit. With a normal frequency transformer, the required spacing is achieved by using separate bobbins on the same core. But when building a switching power supply, a high switching frequency must be used. This also means a much smaller inductance on each winding. To achieve a small inductance, the entire transformer is forced to be much smaller, and thus such a large spacing is almost impossible even with separate bobbins.

Accordingly, there also remains a need for an intrinsically safe universal switching power supply.

BRIEF SUMMARY OF THE INVENTION

The present invention provides an intrinsically safe switching power supply able to cover 9–250 Vac, 40–70 Hz and 9–250 Vdc on the same power cord. The power supply provides outputs of −12V, +5V, +12V, +24V all referred to the earth ground. These voltages are available for digital and analog circuit purposes. The power supply may also generate an isolated 5V output for RS-485 communication applications. The −12V and +12V outputs include an intrinsically safe isolation for an I.S. milliamp output circuit. All the rails are isolated from the input voltage.

To obtain an isolated output while meeting the spacing/layout requirements according to CENELEC standards (EN 50020) and to comply with the international safety standard (IEC 1010-1) to get CSA and FM approvals, according to another aspect the switching power supply according to the present invention includes a transformer with a multi-layer PCB. Utilizing a multi-layer PCB, the spacing requirements are obtained by laying out windings for the transformer within the PCB board/layers. The core for the transformer may comprise a standard planar core.

According to another aspect of the invention, a very wide range of voltages is obtained by including circuitry to produce very narrow pulses to control a MOSFET that switches the transformer.

The power supply according to the present invention comprises one or more of the following features:

(1) an alternating and direct current capability (ac/dc).
(2) an input voltage range which is controlled by the electronics for the full ac/dc range and is transparent to the user, i.e. without the need for a manual voltage range selecting switch.
(3) a maximum input voltage and a minimum input voltage ratio having a factor equal or greater than 7.3.
(4) a fly-back (step-up) topology.
(5) a duty cycle controller capable of providing 10 ns to 7 us pulse outputs.
(6) circuitry for creating the equivalent of a very low impedance MOSFET transistor at low voltage and a quick low stray capacitance MOSFET transistor at high voltage.
(7) at least one intrinsically safe voltage output comprising a PCB transformer and a planar core.

In a first aspect, the present invention provides a switching power supply for generating one or more voltage outputs, and one of the voltage outputs comprising an intrinsically safe voltage output, said switching power supply comprising: (a) an input stage having an input for receiving a supply voltage and a circuit for converting said voltage to a DC level; (b) a first stage coupled to said input stage for receiving said DC level and said first stage having a circuit for generating an output voltage from said DC level; (c) a second stage coupled to said first stage and having a circuit for receiving said output voltage produced by said first stage and including circuitry for generating one or more voltage outputs and an intrinsically safe voltage output; (d) a planar core transformer for isolating said second stage from said first stage; (e) said first stage including primary windings electromagnetically coupled to said planar core transformer, and said primary windings comprising a plurality of conductive tracks formed on a layer of a multi-layer circuit board; (f) said second stage including secondary windings electromagnetically coupled to said planar core transformer, and said secondary windings comprising a plurality of conductive tracks formed on another layer of said multi-layer circuit board, and said secondary windings including windings formed as a plurality of conductive tracks for generating said intrinsically safe voltage output, and said other layer being isolated from said layer carrying said conductive tracks for said primary windings.

In a second aspect, the present invention provides an intrinsically safe switching power supply for generating one or more voltage outputs, said switching power supply comprising: (a) a circuit board having a plurality of layers, and including an opening for receiving a transformer; (b) a first stage having an input for receiving a supply voltage and including a converter circuit for converting said supply voltage to a DC level and having circuitry for producing an output voltage from said DC level, and said first stage including primary windings, said primary windings being formed as conductive tracking on one layer of said circuit board; (c) a second stage coupled to said first stage through said transformer and said second stage including secondary windings for coupling said output voltage produced by said first stage through said transformer, said second stage including circuitry for generating one or more voltage outputs, and said secondary windings being formed as conductive tracking on another layer of said circuit board, and said circuit board including an output layer for said voltage outputs; (d) said second stage including a sub-stage for generating an intrinsically safe voltage output, and said sub-stage comprising a plurality of separate secondary windings for coupling said output voltage produced by said first stage and circuitry for generating said intrinsically safe voltage output, and said separate secondary windings comprising conductive-tracking formed on another layer of said circuit board, and said layer carrying the conductive tracking for said intrinsically safe voltage output being isolated from said other layers in said circuit board.

In another aspect, the present invention provides a switching power supply for generating one or more voltage outputs, said switching power supply comprising: (a) an input stage having an input for receiving a supply voltage and a circuit for converting said voltage to a DC level; (b) a first stage coupled to said input stage for receiving said DC level and said first stage having a circuit for generating an output voltage from said DC level; (c) a second stage coupled to said first stage and having a circuit for receiving said output voltage produced by said first stage and including circuitry for generating one or more voltage outputs and an intrinsically safe voltage output; (d) a planar core transformer for isolating said second stage from said first stage; (e) said first stage including primary windings electromagnetically coupled to said planar core transformer, and said primary windings comprising a plurality of conductive tracks formed on a layer of a multi-layer circuit board; (f) said second stage including secondary windings electromagnetically coupled to said planar core transformer, and said secondary windings comprising a plurality of conductive tracks formed on another layer of said multi-layer circuit board, and said other layer being isolated from said layer carrying said conductive tracks for said primary windings; (g) said circuit for generating an output voltage in said first stage including a switching device and a controller coupled to said switching device, said switching device being coupled to said primary windings, and said switching device switching a current through said primary windings under the control of said controller.

In a yet another aspect, the present invention provides a switching power supply for generating one or more voltage outputs, and one of the voltage outputs comprising an: intrinsically safe voltage output, said switching power supply comprising: (a) an input stage having an input stage for receiving a supply voltage and a circuit for converting said supply voltage a DC level input; (b) a first stage coupled to said input stage for receiving said DC level and said first stage having first stage circuit for producing an output voltage from said DC level; (c) a second stage coupled to said first stage and having a circuit for receiving said output voltage produced by said first stage and including a circuit for generating one or more voltage outputs and an intrinsically safe voltage output; (d) a planar core transformer for isolating said second stage from said first stage; (e) said first stage including primary windings electromagnetically coupled to said planar core transformer, and said primary windings comprising a plurality of conductive tracks formed on one layer in a multi-layer circuit board; (f) said second stage including secondary windings electromagnetically coupled to said planar core transformer, and said secondary windings comprising a plurality of conductive tracks formed on one or more layers in the multi-layer circuit board; (g) a start-up stage coupled to said first stage and said input stage, said start-up stage including means for starting said power supply during a low period.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be to the accompanying drawings, which show by way of example, preferred embodiments of the present invention, and in which:

FIGS. 2(a) to 2(c) are diagrammatic views of a transformer PCB configuration for the power supply of FIG. 1;

DETAILED DESCRIPTION OF THE INVENTION

Figure 1:
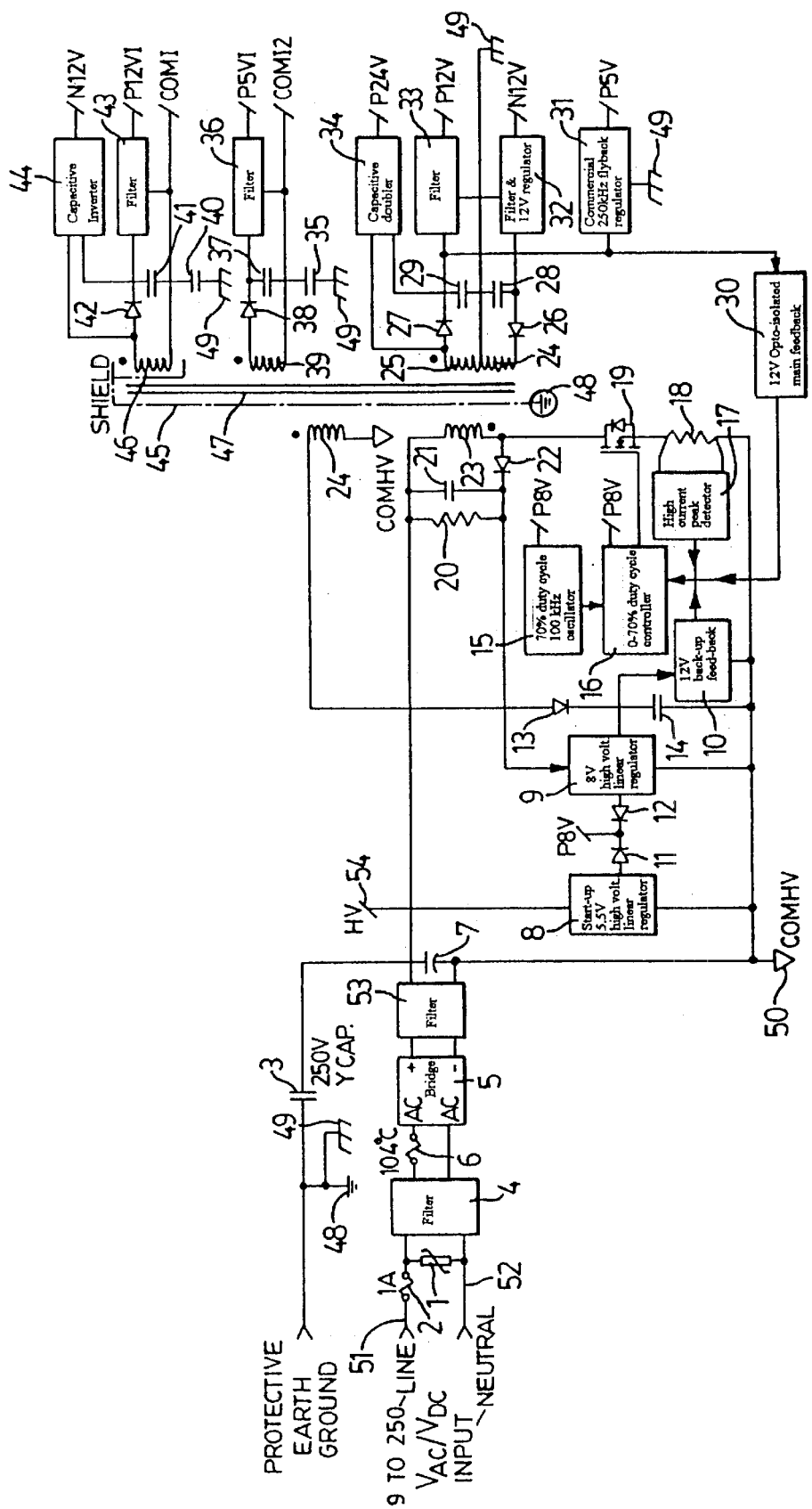
FIG. 1 shows in diagrammatic form an intrinsically safe universal switching power supply according to the present invention.

Reference is first made to FIG. 1 which shows in block diagram form an intrinsically safe universal switching power supply 1 according to the present invention.

As shown in FIG. 1, the power supply 1 receives a 9 to 250 Vac/Vdc voltage which is applied on line 51 and neutral 52. A protective earth ground 48 is provided for safety and for filtering. Preferably, the protective earth ground 48 is able to withstand 30 amperes at any point. To be considered an intrinsically safe ground, the protective earth ground 48 is made as a 1 oz. copper layer on the multi-layer printed circuit board PCB as described below. If an ac voltage is applied, it is preferably between 40 to 70 Hertz.

A 1-ampere fuse 2 with a minimum of 4000 Amperes of rupture capability is provided to protect the circuit for the power supply 1. A varistor v is provided to protect the circuitry for the switching power supply 1 against a 2000-Volt & 2-Ω surge. Advantageously this fulfills an EMC requirement for the CE certification or standard marking. The ac/dc voltage is then filtered with a filter 4 to reject the common mode noise generated by the switching. This is another EMC requirement to get the CE marking. A 104° C. thermal fuse 6 (also shown in FIG. 2) is connected before a rectifier bridge 5. It is preferable to install the thermal fuse 6 in this location since it is physically sitting under the PCB transformer and can pick up a high frequency noise. This noise will be filtered by a common mode choke (not shown) in the filter 4. It will be appreciated that the noise would not have been filtered if the thermal fuse 6 had been the other side of the filter 4.

The ac/dc voltage is rectified by a diode bridge rectifier 5 and is filtered by a high frequency filter 53 preferably having a COG ceramic capacitor and a ferrite bead. The filter 53 is intended to filter the noise over 50 MHz created by the switching. A low impedance and low value capacitor 7 is connected at the output of the filter 53 to remove ripple at the output of the diode bridge rectifier 5. The purpose of the capacitor 7 is not to get a pure dc voltage with no ripple, rather the capacitor 7 provides a source of current for the high peak of current created by switching the primary winding of the transformer. As shown in FIG. 1, the power supply 1 includes a transformer 24 with primary windings 23 and secondary windings 25.

As shown in FIG. 1, a switching transistor 19 is provided and connected to the primary winding 23 of the transformer 24. The switching transistor 19 comprises a MOSFET device. To switch the transistor 19 at high frequency, the circuitry for the power supply 1 includes a high frequency oscillator 15 and a controller 16 that modify the switching duty cycle. Since a MOSFET transistor gate has a Vgs=4 Volts and needs about 8 Volts to turn on, the voltage is generated from the high voltage rail 54 of the circuitry. The HV voltage rail 54 can be as low as 6.8 Volts when the input voltage is 8.2 Volts and as high as 400 Volts when a high ac voltage is applied at the input 51. For this reason, a linear regulator 8 is coupled directly to the HV voltage rail 54. As the oscillator 15 and the controller 16 may consume up to 10 mA at high voltage, the dissipation into the linear regulator could be as high as 4 Watts. As a result, the linear regulator 8 is preferably only used as a start-up circuit and another more efficient 8 Volts is generated from the switching transformer 24. It is preferable to start up the circuitry for the power supply 1 with 5.5 Volts from the regulator 8 and generate about 10 Volts across a capacitor 14 from the secondary winding of the transformer 24. This 10 Volts is then regulated to around 8 Volts by a regulator 9. As shown in FIG. 1, two diodes 11, 12 are coupled between the regulators 8, 9. Because of the two diodes 11 and 12, as soon as the power supply 1 begins to generate a higher voltage than 5.5 Volts, the regulator 8 is disabled and no longer dissipates any power.

The oscillator 15 generates a 100 kHz, 70% duty cycle square wave. The 70% duty cycle corresponds to the maximum duty cycle allowed by the controller 16. A change in the duty cycle would change the maximum duty cycle allowed by the controller 16. The frequency of 100 kHz is selected as basic frequency to be more than twice the switching frequency (i.e. 44 kHz) of other oscillators in ultrasonic equipment which is a primary application for the power supply 1. It is not desirable to generate a frequency that could be picked up by the receivers. It will however be appreciated that the frequency may be adjusted for other applications. At 7.6 Vdc of input voltage, a MOSFET transistor has a time-on duration of around 4.4 us. At 387.5 Vdc the time-on is 86 ns. If the circuit load is decreased by 1/10, the time-on duration could be as short as 8.6 ns at 387.5 Vdc. This means that the MOSFET transistor 19 must be able to switch very fast and the controller 16 has to be able to produce very narrow pulses.

The switching power supply 1 features a set of output rails having different voltages. Coupled between the transformer 24 and each of the rails may be any one of various of components, including a fly back regulator 31, a filter and 12 volt regulator 32, a filter 33, a capacitive doubler 34, a filter 36, a filter 43, or a capacitive inverter 44.

For the values:

| | |
|---|---|
| $V_{min}$ = 7.6 Vdc | The 7.6 Vdc comes from 7.6 Vdc = 9 Vdc (Voltage drop in the diode rectifier bridge 5) |
| $V_{max}$ = 387.5 Vdc | The 400 Vdc comes from (275 Vac* √2) – 1.4 Vdc = 387.5 Vdc |
| F = 100 kHz | Switching frequency. |

First the inductance of the primary winding 23 for the transformer 24 is determined. The configuration of the output and the load on each secondary winding of the transformer 24 to calculate the output power needs to be known. A table of the different voltages on each rail (as shown in FIG. 1) with their respective current and power consumption is provided according to one embodiment:

| Name of rail | # of turns | Real produced voltage | Current on rail | Power dissipation calculation (Dissipation from the winding point of view) |
|---|---|---|---|---|
| P24V | — | 25.18 | Not used | Not used |
| P12V | 10 | 13.14 | 0.080 | P = 13.14 * 0.080 = 1.051 |
| P5V | — | 5.0 | 0.120 | P = (5.0 * 0.120)/0.90 = 0.667 |
| N12V | 10 | −13.14 | −0.050 | P = −13.14 * −0.050 = 0.657 |
| P5V1 | 4 | 5.256 | 0.045 | P = 5.256 * 0.045 = 0.237 |
| P12VI | 10 | 13.14 | 0.030 | P = 13.14 * 0.030 = 0.394 |

-continued

| Name of rail | # of turns | Real produced voltage | Current on rail | Power dissipation calculation (Dissipation from the winding point of view) |
|---|---|---|---|---|
| N12VI | — | −12.04 | −0.030 | P = (−12.04 − 0.7 − 2 * 0.2) * −0.030 = 0.394 |
| P8V | 8 | 7.7 | 0.01 | P = 10.512 * 0.01 = 0.105 |
| | | | | Total power = 3.505 Watts |

It will be appreciated that there are n turns for the rails P5V, P24V & N12VI. It is because these voltages are obtained by other methods a s switching capacitors or switching integrated circuits. The 24V is not used and is provided for a future requirement. It will not be considered in the present exemplary power consumption calculation.

To calculate the peak current in the primary winding 23 of the transformer 24 and the value of the inductance:

$$V = \frac{(*dI)}{dt} \quad \text{Voltage across an inductance in general}$$

$$F = \frac{1}{t_{on} + t_{off}} \quad \begin{array}{l}\text{Frequency at 9 Vdc}\\\text{(Not true at higher voltage)}\end{array}$$

$$E = \frac{1}{2}*L*1^2 \quad \text{Energy stored in the magnetic field}$$

$$L = N^2 * A_L \quad \text{Inductance value calculation}$$

$$L_T = L_1 + L_2 + L_3 + L_4 + L_5 \quad \text{Total inductance}$$

With the previous formulae and with some mathematical manipulations, the following is determined:

$$I_p = 2*P_{out}*\left[\frac{1}{V_{min}} + \left[\left(\frac{N_{s1}}{N_p*V_1}\right) + \left(\frac{N_{s2}}{N_p*V_2}\right) + \left(\frac{N_{s3}}{N_p*V_3}\right) + \left(\frac{N_{s4}}{N_p*V_4}\right) + \left(\frac{N_{s5}}{N_p*V_5}\right)\right]\right]$$

$$L = \frac{1}{F*I_p*\left[\frac{1}{V_{min}} + \left[\left(\frac{N_{s1}}{N_p*V_1}\right) + \left(\frac{N_{s2}}{N_p*V_2}\right) + \left(\frac{N_{s3}}{N_p*V_3}\right) + \left(\frac{N_{s4}}{N_p*V_4}\right) + \left(\frac{N_{s5}}{N_p*V_5}\right)\right]\right]}$$

With the specific input/output voltages and the consumption of each output to be achieved, the following values are determined:

$I_p$=2.096 Amperes
L=16 $\mu$H

With a 72% average efficiency in fly-back power supplies, a total power consumption of 4.87 Watts at the input of the circuitry may be expected.

In operation, when voltage range is 7.2 Vdc to 387.5 Vdc and taking into account the 1.4-Volt drop in the rectifier bridge and the highest dc voltage is reached when the 250 Vac+10% voltage is rectified, then the circuit provides 387.5 Vdc. Further, the switching power supply 1 of the present invention provides a ratio between the highest voltage and the lowest voltage in the range of 27.7, and for the 9 to 250 Volt range, the ratio is up to 51.

Figure 3:
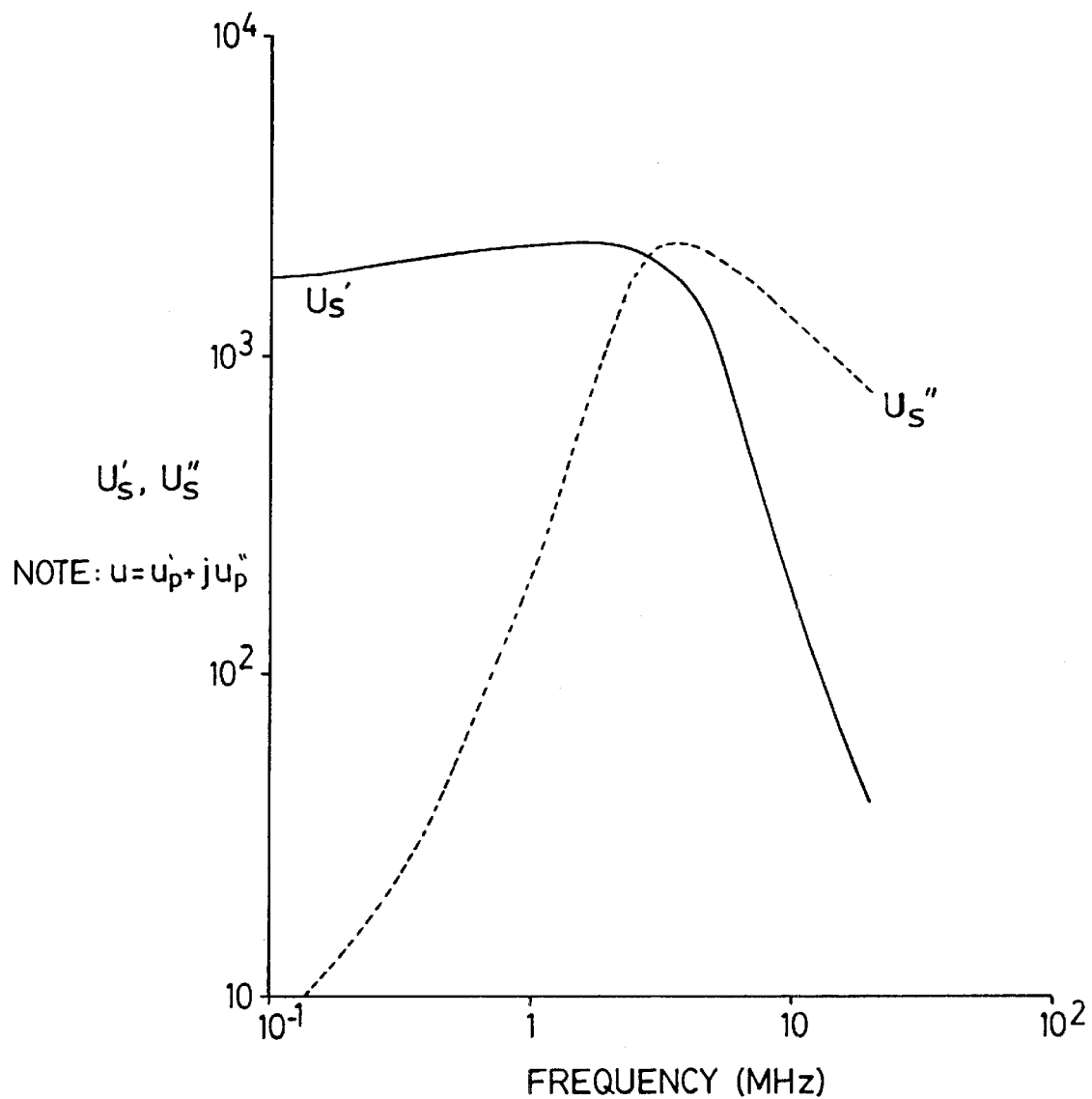
FIG. 3 is a graph showing the relative permeability, as a function of the frequency.

According to another aspect of the present invention, the transformer 24 for switching power supply 1 utilizes planar transformer and planar core technology such that available from the Philips company. For a planar transformer, the windings are formed as tracks on the printed circuit board or PCB. In the context of the present invention, the material must be able to work from 100 kHz up to 5.8 MHz in a regular 9–250 Vac/Vdc application. This wide frequency response is required to produce the large 4.4-us pulses at 7.6 V and the 86-ns narrow pulses at 387.5 Vdc. In the present embodiment, the 3F3 Philips material is used to achieve that wide frequency range (as illustrated in FIG. 3).

Figure 4:
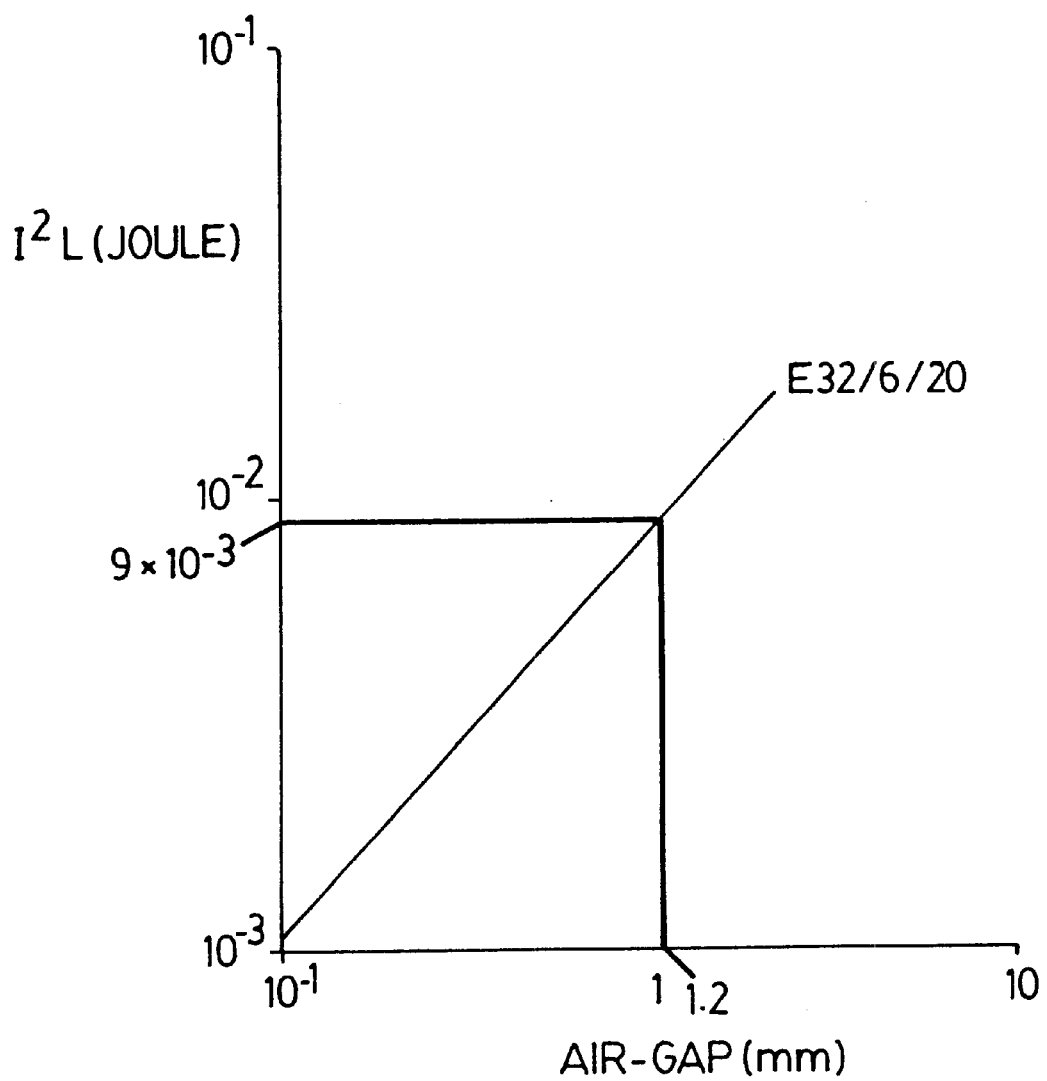
FIG. 4 is a graph showing the maximum energy as a function of air-gap.

The Philips company produces planar transformers with different core sizes. It has been found that the minimum size requirement to fit all windings for switching is a 32 mm core (in the E32/6/20 series). In addition to fitting the windings for power supply 1 according to the present invention, the selected core must also be able to transfer the energy. A graph of the energy($L^{-}|^2$) as a function of the air-gap for a 3F3 Philips E32/6/20 core is illustrated in FIG. 4. To get a 16 $\mu$H inductor, a 1.2-mm air-gap in a 3F3 E32/6/20 core is needed. For $|_p$=2,096 Amperes and for a 16 $\mu$H inductor, $L^{-}|^2$=70 uJ is determined according to FIG. 4. It is determined that a 1.2-mm air-gap yields 9 mJ=9000 uJ. Since this is 128 times more than needed, in the subject application, it is acceptable to use a 3F3 core in the Philips E32/6/20 series. The Philips 3F3 core is big enough to meet the minimum physical requirement and the maximum energy requirement.

Reference is next made to FIG. 2 which shows a 3 dimensional view of a multi-layer PCB transformer 100 implementation for the transformer 24 (FIG. 1) in the switching power supply 1 (FIG. 1). The PCB transformer 100 comprises a planar core 57, a 10-layer printed circuit board or PCB 56, silicon glue 65, Kepton tape 58, a thermal fuse 55 and two connectors 162, 163. The planar core 57 comprises a 3F3 material E-Core 63 and a 3F3 material plate 66 as shown in FIG. 2(b). According to the CENELEC standard (EN 50020), the two connectors 162, 163 and the thermal fuse 55 (FIG. 2(c)) are wave soldered. This is to provide reliable connections between the power supply board and the transformer PCB 56. The E-core 63 is glued on the PCB 56 with the silicon glue 65. This is necessary to fill the gap between the board 56 and the core 63 and to pass the vibration test. It is not necessary to glue the plate 66 with the PCB 56 since it is well tied together with the Kepton tape 58.

Figure 21:
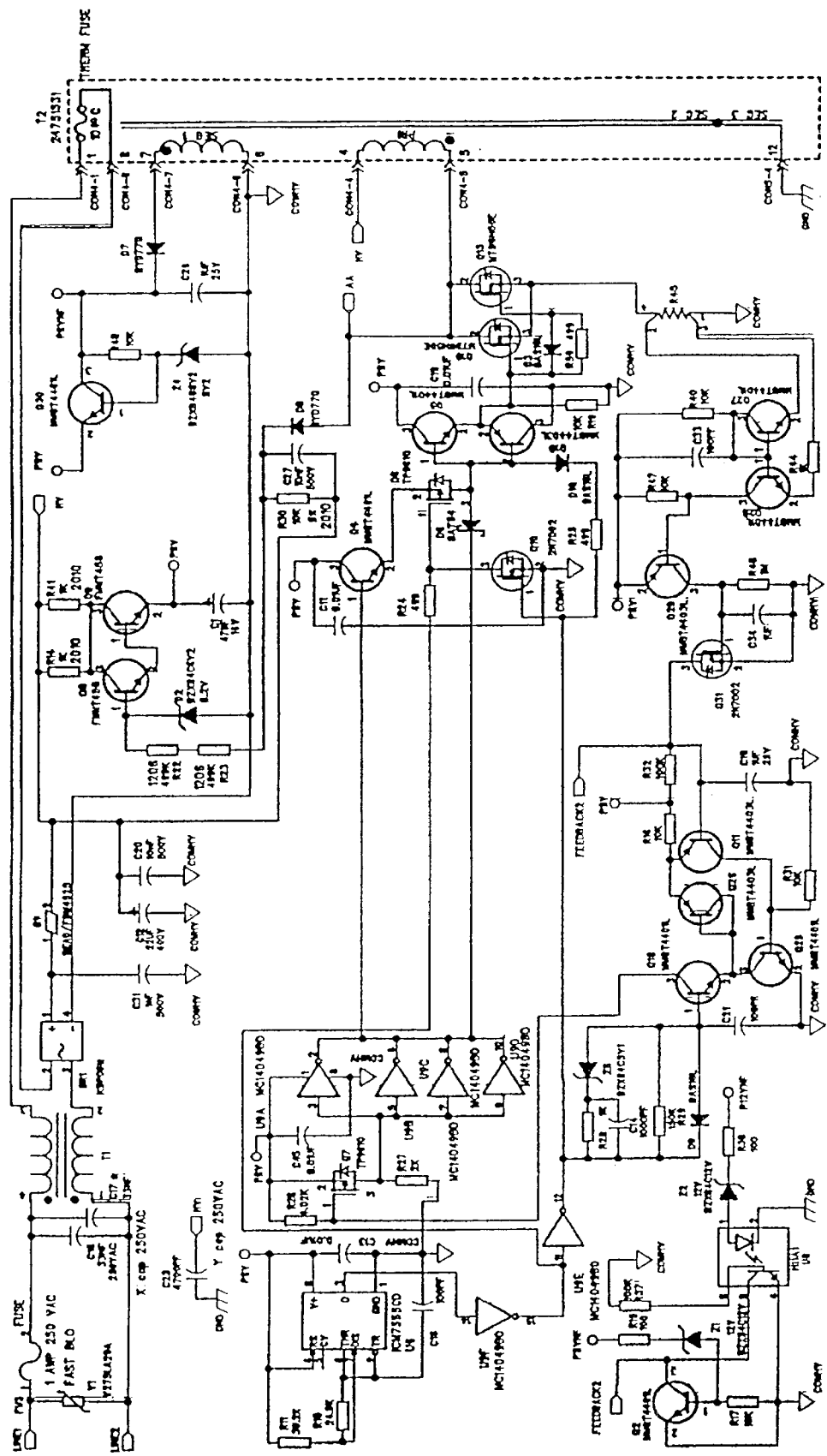
FIG. 21 is a schematic showing the high voltage side of the power supply.

As shown in FIG. 2, the thermal fuse 6 sits under the transformer. Once the PCB transformer 100 is installed on the main power supply board, a 22 $\mu$F, 400V electrolytic capacitor (C12 in FIG. 21) also sits under the PCB transformer 100. The thermal fuse 6 becomes sensitive to the heat generated by the 10-layer PCB 56 and also to the heat generated by the C12 capacitor (FIG. 21). The capacitor C12 is a 105° C. capacitor, and the 10-layer PCB 56 is rated for 130° C. The Curie temperature of the planar core 57 is over 200° C., and as a result in this construction, the weakest component is the C12 capacitor. Because of the 105° C. rating of the capacitor C12, a 104° C. thermal fuse 6 is selected. The thermal fuse 6 is spec'd to blow up under 104° C. but never over.

Figure 5:
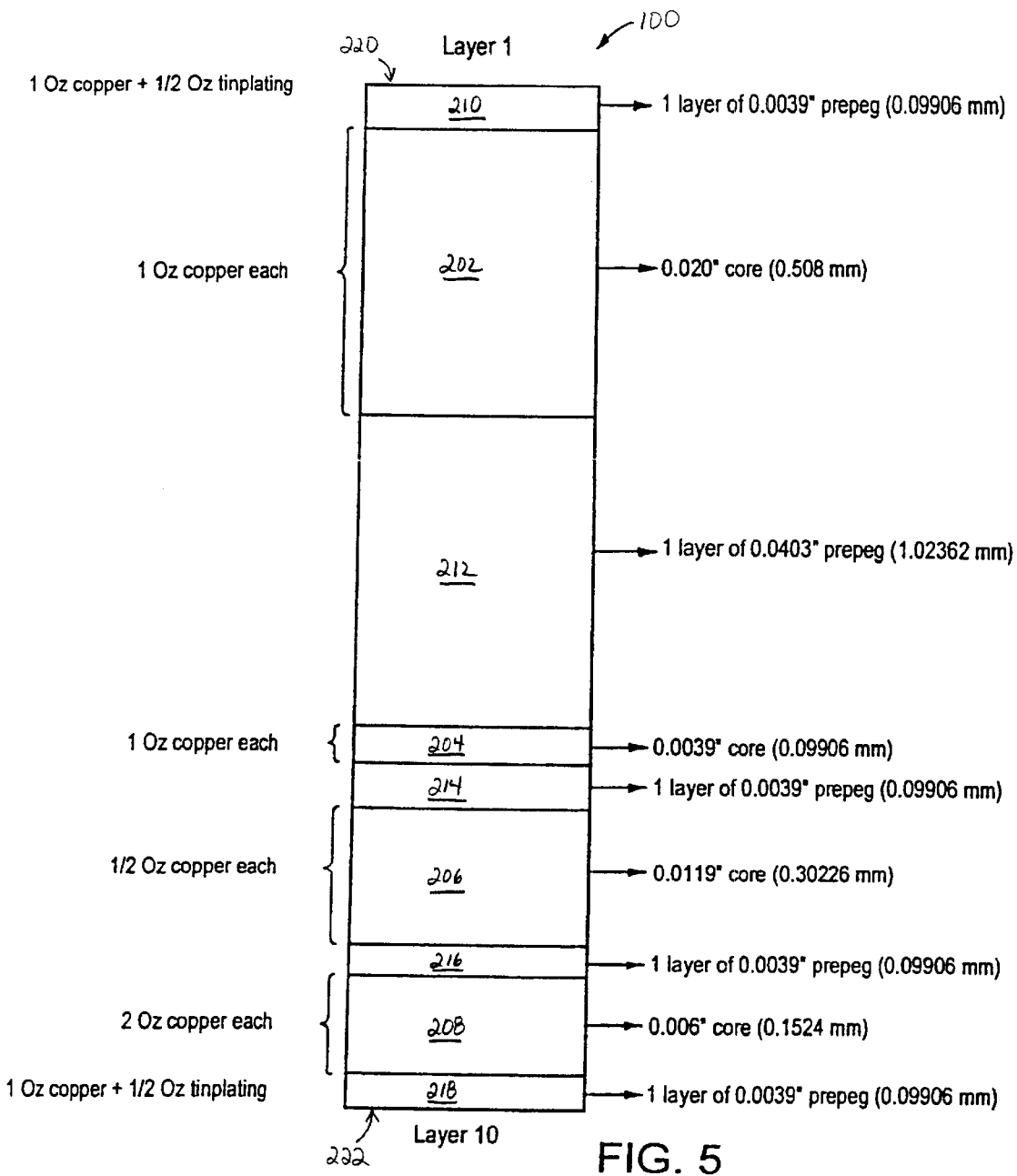
FIG. 5 is a cross-sectional view of the layers in a transformer printed circuit board (PCB) according to the invention.

Reference is made to FIG. 5 which shows a cross sectional view of the 10-layer PCB transformer 100. The PCB transformer 100 comprises four core layers 202, 204, 206, 208 separated by five prepeg layers 210, 212, 214, 216, 218. The top 220 (layer 1) and bottom 222 (layer 10) are made with a 1 Oz copper foil plated with ½ Oz tin. It is important to note that according to the CENELEC standard (EN 50020), all intrinsically safe shield or guard must have at least 1 Oz of copper. Tin plating does not apply to thickness.

Figure 6:
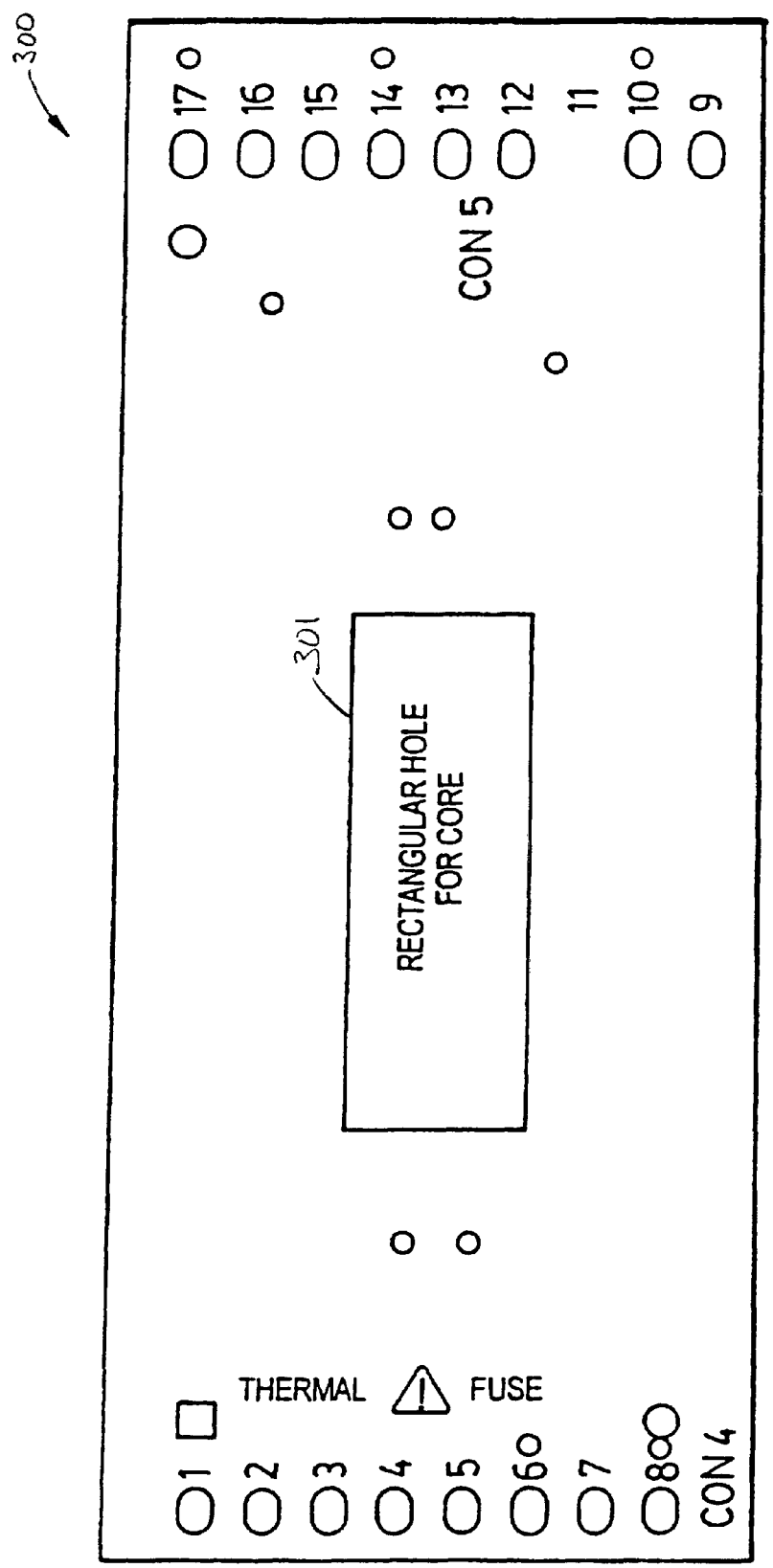
FIG. 6 is a diagrammatic view of the first layer for the transformer PCB.
Figure 7:
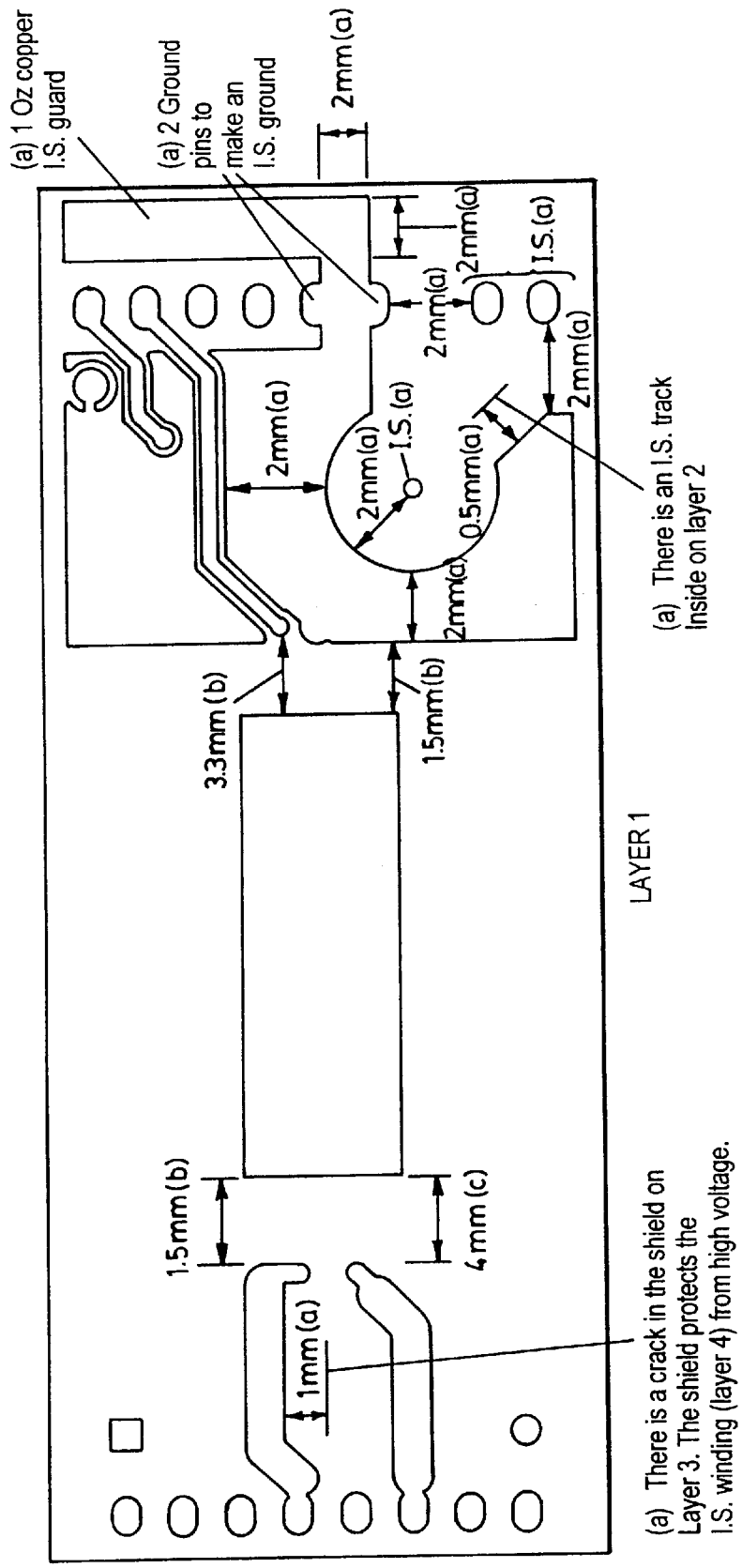
FIG. 7 is a diagrammatic view of the top layer of the transformer PCB.
Figure 8:
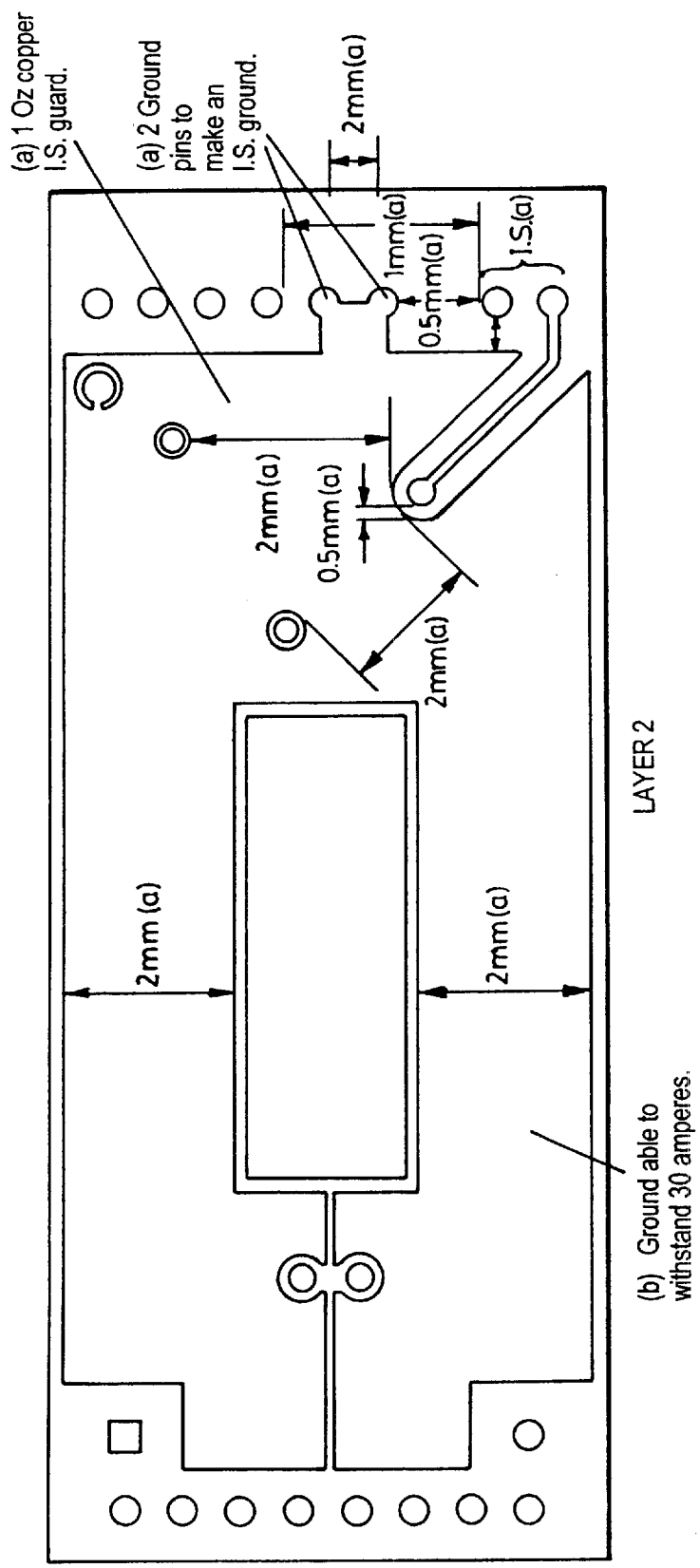
FIG. 8 is a diagrammatic view of the intrinsically safe (I.S.) shielding layer of the transformer PCB.
Figure 9:
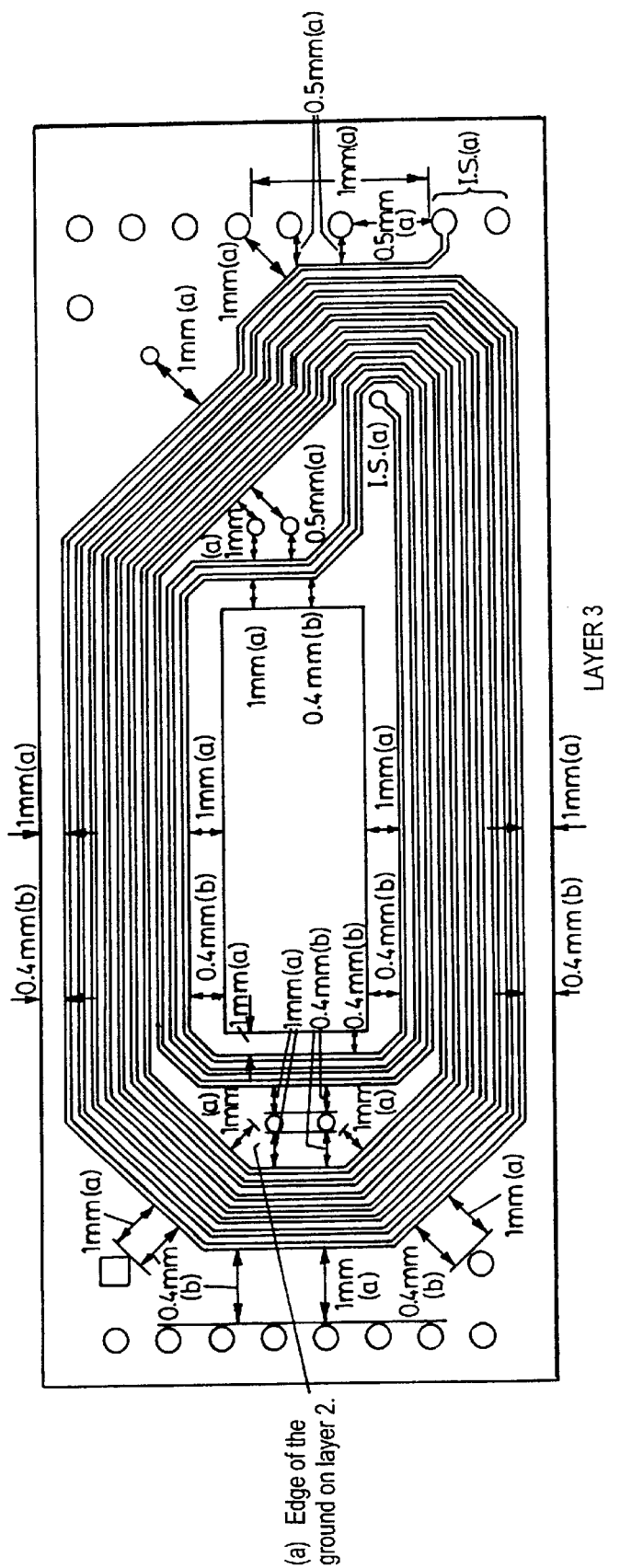
FIG. 9 is a diagrammatic view of the low voltage side I.S. output secondary layer of the transformer PCB.
Figure 10:
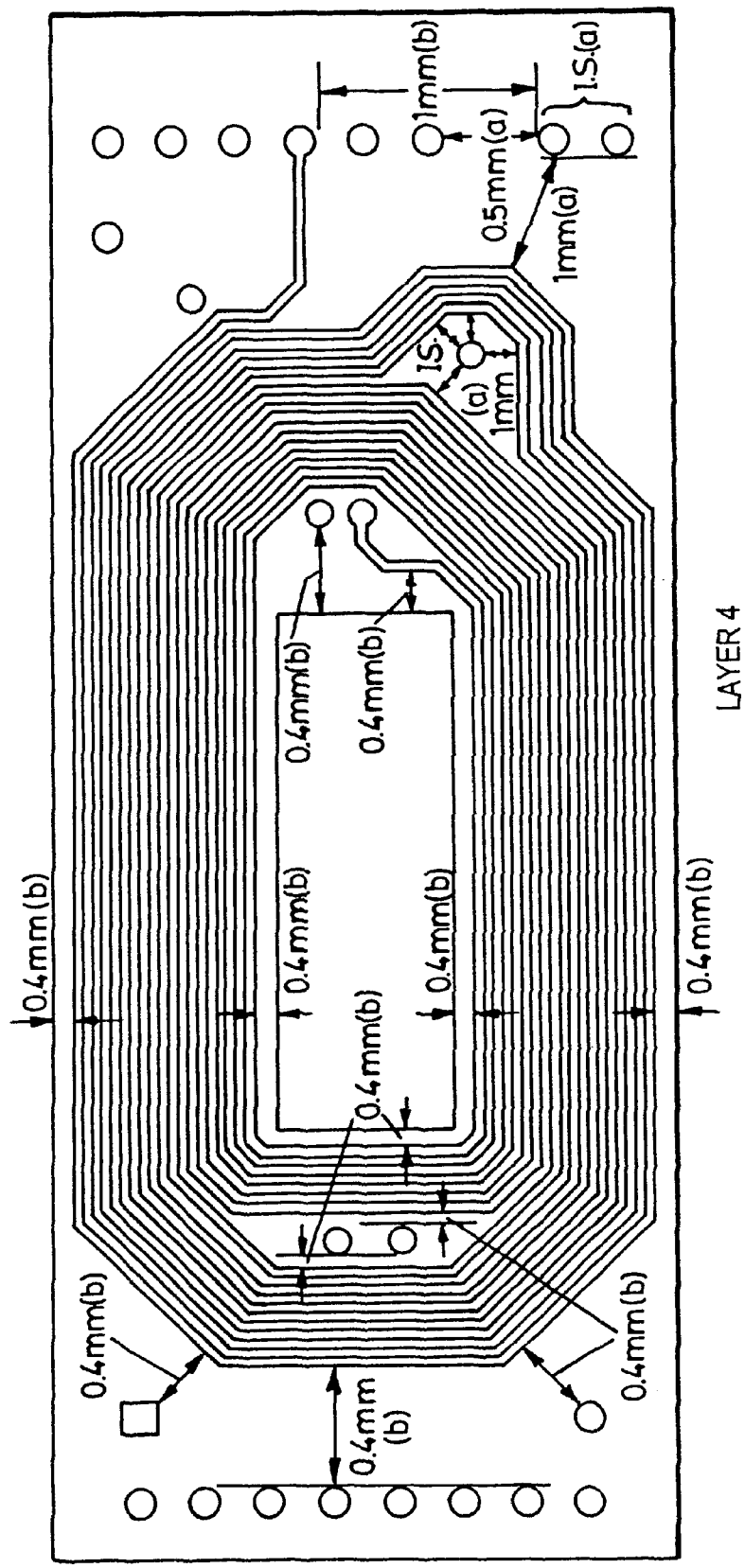
FIG. 10 is a diagrammatic view of the low voltage side P12V output secondary of the transformer PCB.
Figure 11:
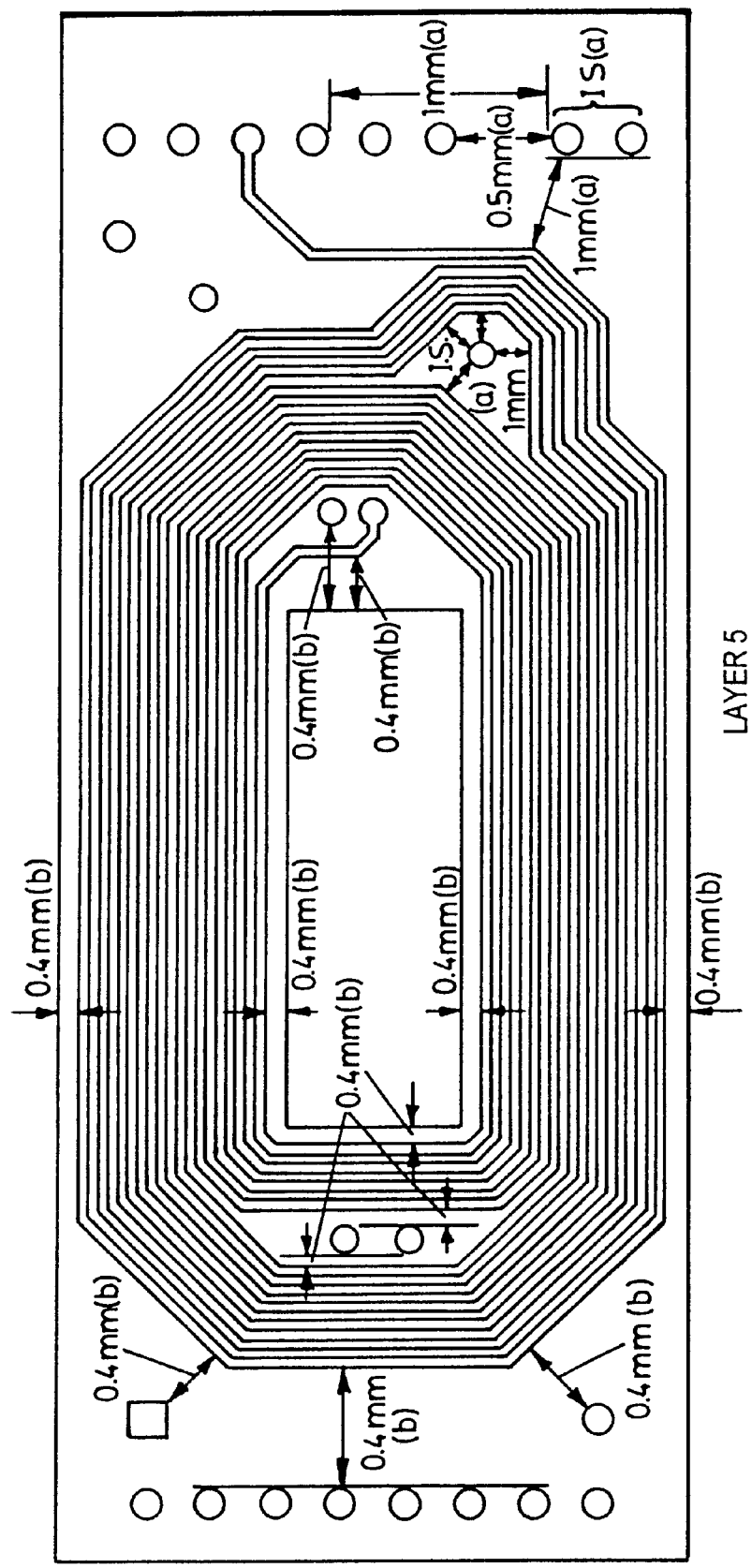
FIG. 11 is a diagrammatic view of the low voltage side N12V output secondary layer of the transformer PCB.
Figure 12:
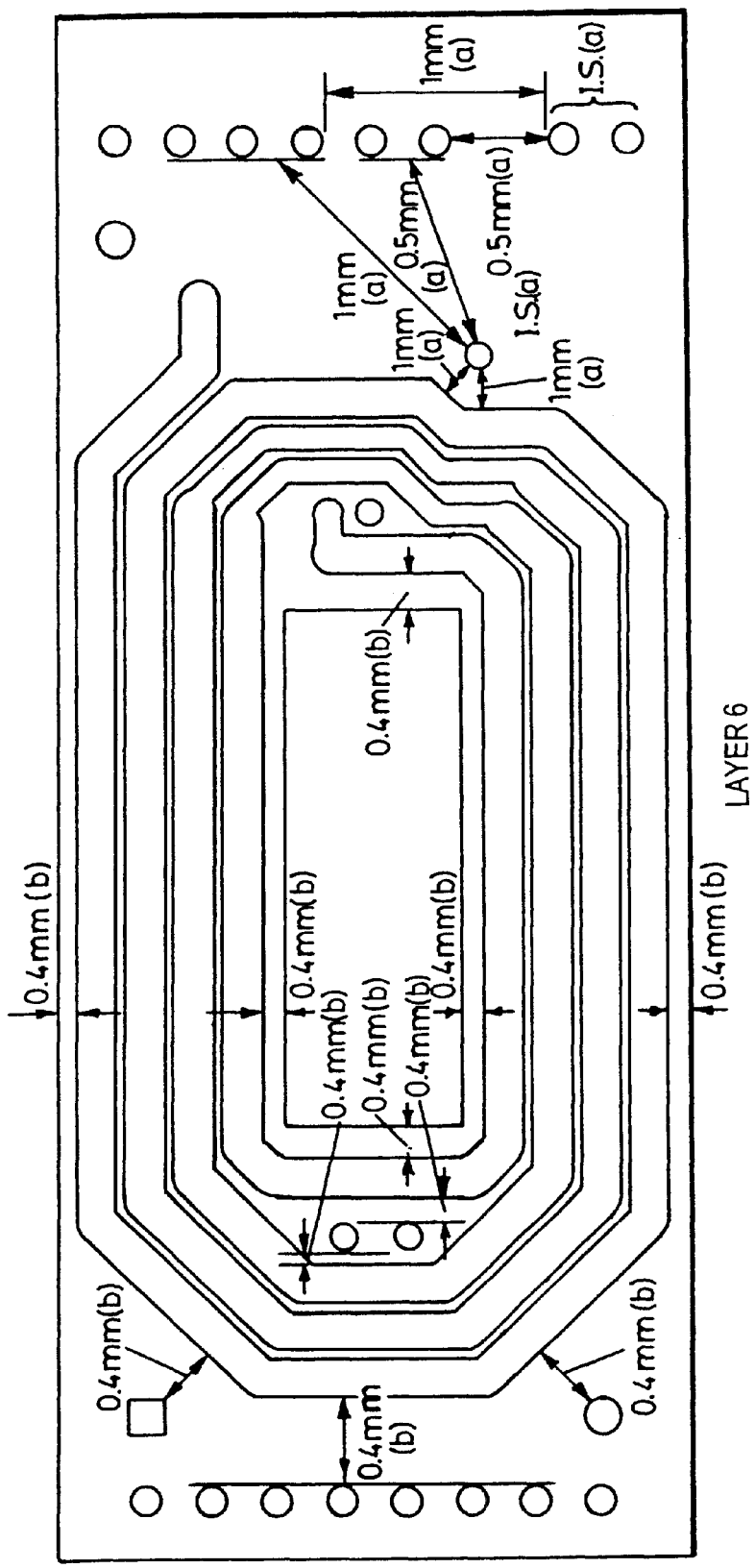
FIG. 12 is a diagrammatic view of the low voltage side P5VI output secondary layer of the transformer PCB.
Figure 13:
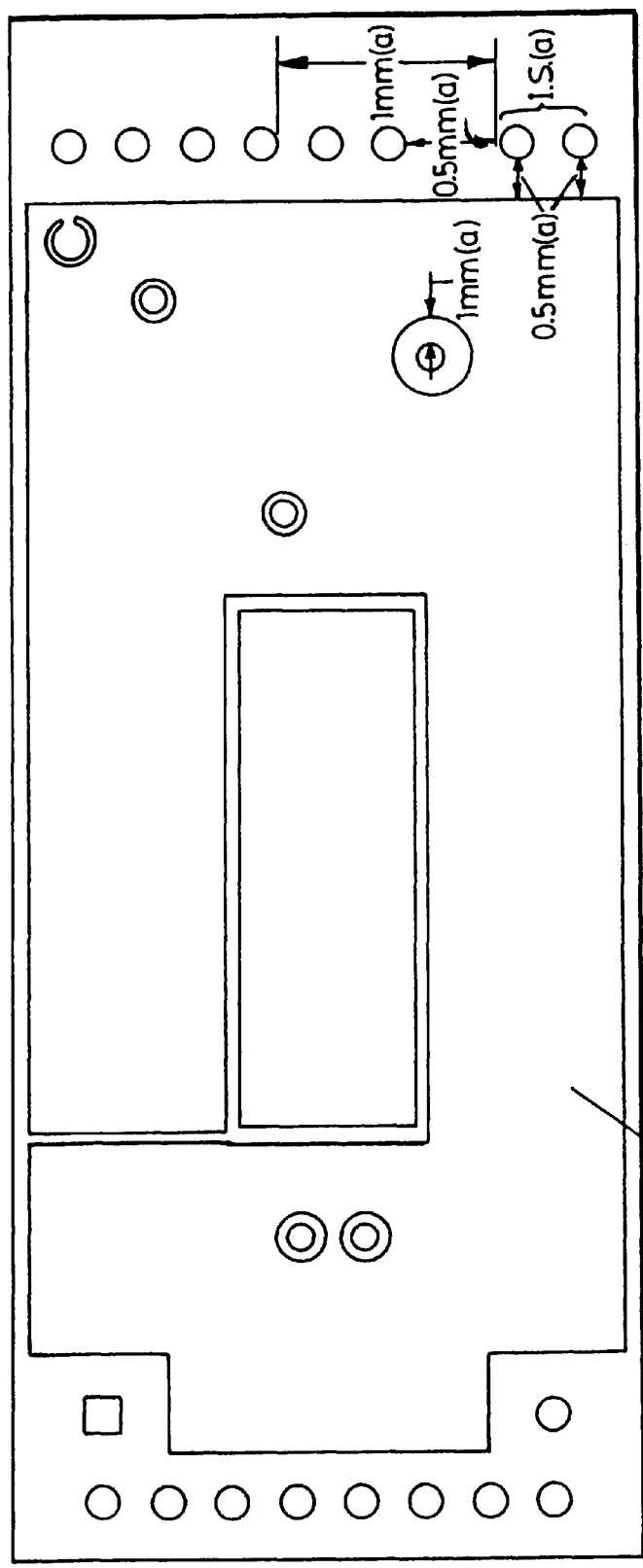
FIG. 13 is a diagrammatic view of the GND layer for the transformer PCB.
Figure 14:
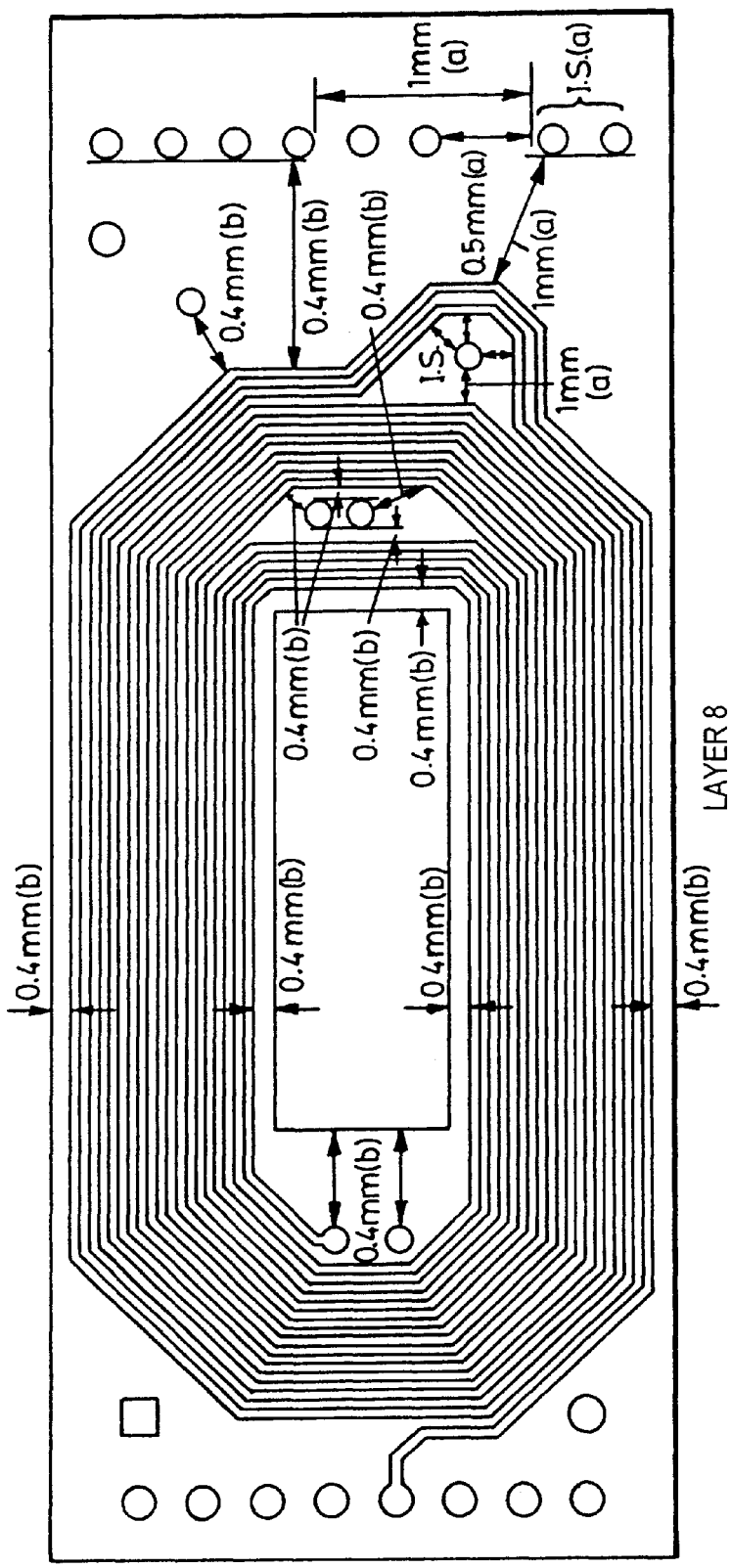
FIG. 14 is a diagrammatic view of the high voltage side primary for the transformer PCB.
Figure 15:
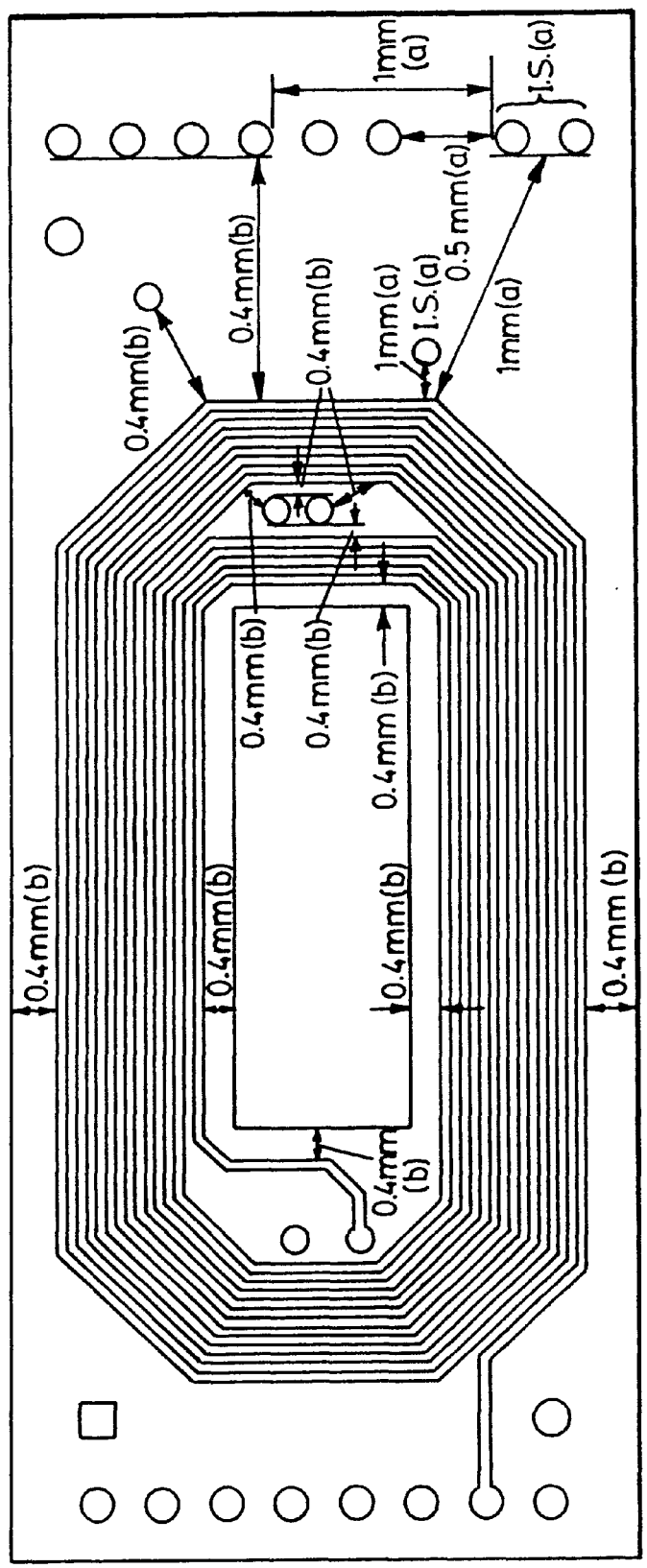
FIG. 15 is a diagrammatic view of the high voltage P12VHV output secondary for the transformer PCB.
Figure 16:
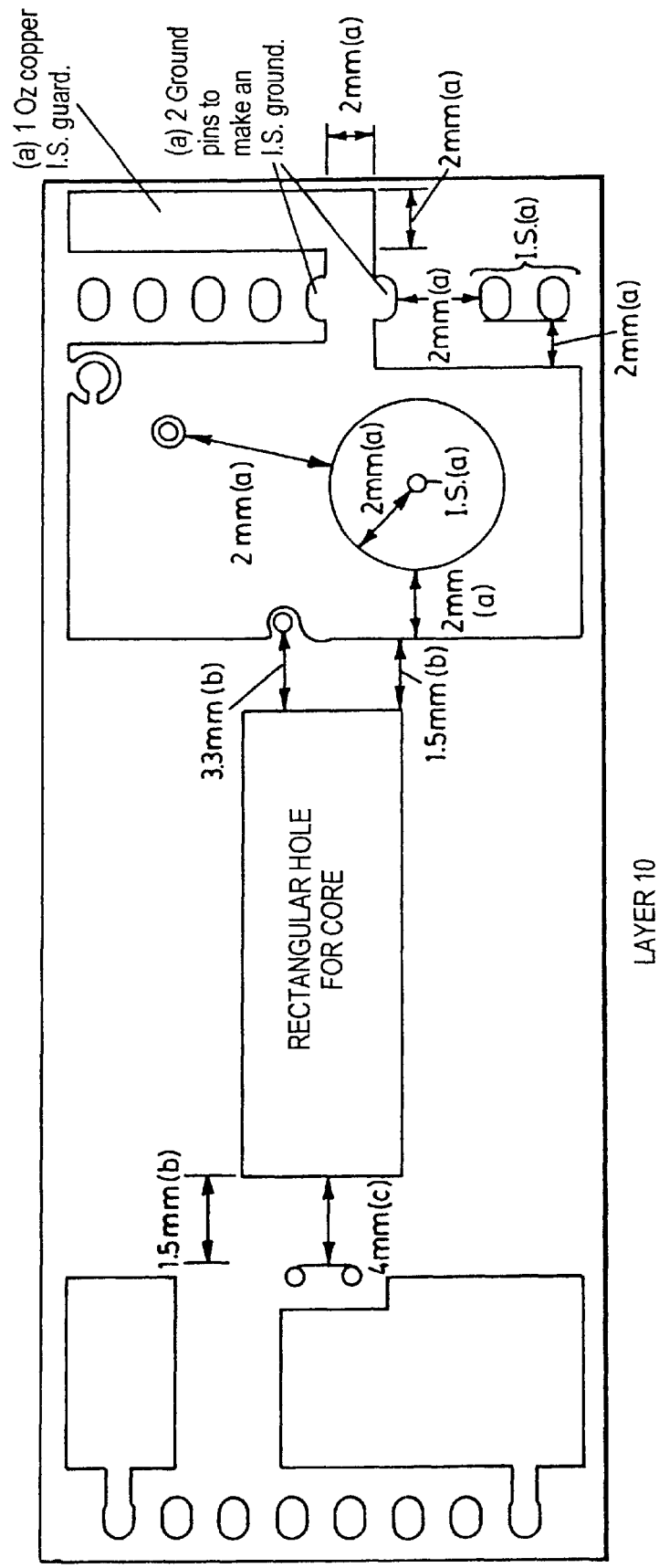
FIG. 16 is a diagrammatic view of the bottom of layer 10 for the transformer PCB.
Figure 17:
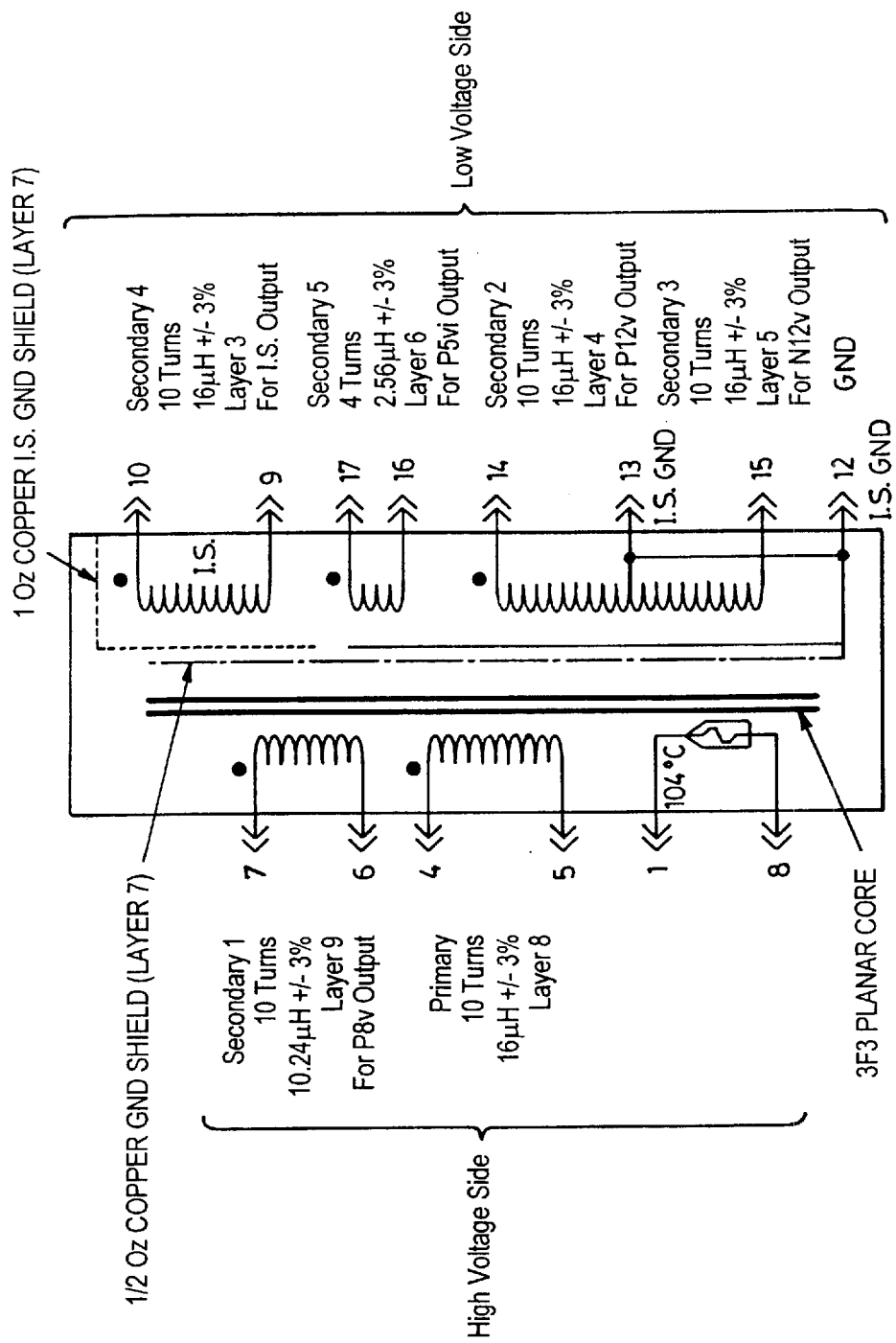
FIG. 17 is a schematic view of the PCB transformer.

Reference is next made to FIG. 6 which shows a layout 300 (e.g. "silkscreen") for the PCB transformer 100. It is important to have no layout, e.g. tracks, in the planar core area denoted by 301. The tolerance (i.e. thickness) of the board is critical in the core area 301. It is noted that the total thickness of the board is 0.1145"+/−10%. But in the core area 301 of the board, as there is no copper on top and bottom of the board, there is only 0.1103"+/−10%. Philips specify a free room of 0.1252"+/−0.0079" between the E-core 63 (FIG. 2) and the plate 66 (FIG. 2). As a result, there is a potential conflict. The PCB board may have a thickness of 0.1213" while the core may only provide 0.1173". In that situation, the air-gap (that is already 1.2 mm) would be increased by 0.0004". (0.1 mm). This is a rare situation which will not typically be a problem. The inductance will vary a bit but not enough to create a real problem. However, preferably the production test procedure will catch any transformer unit that causes a problem.

Reference is next made to FIGS. 7 to 16 which show the layout (i.e. silkscreen artwork) for each layer in the multi-layer (i.e. 10) PCB 56 on a 3:1 scale. The spacing requirements for the different approval agencies are described below in the context of the power supply 1 according to the present invention.

The layout tracks/windings denoted by reference "(a)" in FIGS. 7 to 16 requires minimum spacings in order to meet the requirements for an intrinsically safe output under the EN 50020 CENELEC standard. The following is a summary of the rules applied to the layout of the multi-layer PCB 56 under the EN 50020 standard. The EN 50020 standard as will be familiar to those skilled in the art may be referenced for more details:

- The distance through isolation between the intrinsically safe (I.S.) winding and all other windings is at least 1 millimetre.
- The distance through isolation between the I.S. winding and the I.S. earth ground is at least 0.5 millimetre.
- The distance on the surface of the board between the I.S. winding and all other windings is at least 10 millimetres.
- The distance on the surface of the board between the I.S. winding and the I.S. earth ground is at least 2 millimetres.
- The distance, through air between the I.S. winding and all other windings-is at least 6 millimetres.
- The thickness of all I.S. earth ground shields and I.S. grounded guards is at least 1 oz. copper.
- The width of all I.S. grounded guards is at least 2 millimetres.
- In case of a fault, the temperature of windings cannot reach the Curie temperature of the core transformer and cannot reach the temperature specification of the PCB material.
- A thermal fuse connected in series with the main power must be mounted on the PCB transformer to prevent any damage to the PCB isolation if ever there is a failure somewhere in the power supply.
- Two independent pins bring the earth ground to the PCB to provide what we call the I.S. earth ground.
- A wave-soldering machine is used to solder the connectors (a manual soldering is not allowed under the standard).
- A safe I.S. output must be provided even if there is two faults (as defined in the EN 50020 standard).
- The I.S. output must pass successfully the Hipot test.

The layout tracks/windings on the multi-layer PCB 56 denoted by reference "(b)" are required to meet minimum spacing and requirements to pass the CSA & FM general safety approvals (International IEC 1010-1 standard). The following is a summary of the rules applied (the IEC 1010-1 standard provides details as will be understood by those skilled in the art):

- The distance through isolation between any accessible windings and high voltage is at least 0.4 millimetre.
- The distance through isolation between high voltage and protective earth ground is minimum.
- The distance on the surface of the board between any accessible windings and high voltage is 3.3 millimetre or two times 1.5 mm.
- A protective ground must be able to withstand 30 Amperes during one minute.
- The high voltage windings and all accessible outputs must pass successfully the Hipot test.

The layout tracks/windings on the multi-layer PCB 56 denoted by reference "(c)" in FIGS. 7 to 16 are required to meet minimum spacing and requirements to pass the 400 Vp common mode surge test (EMC requirement) an intrinsically safe output (EN 50020 CENELEC requirements). The following rules apply:

The CENELEC safety agency does not allow for the connection of any varistor between the neutral and ground to pass the EMC "Surge" test (4000 VP in common mode). Therefore, it is necessary to keep at least 4 millimetres in air and on the surface of the board between the high voltage and any earth ground and secondary windings. It will be appreciated that high voltage refers to all windings connected directly or indirectly to the main power source without a galvanic isolation.

As described above with reference to FIG. 1, a MOSFET transistor is used for the switching element 19 because of its characteristic very fast switching time and high voltage capability. It will be appreciated that a MOSFET transistor having high current capabilities will also have very high stray capacitance. It is even higher with heavy loads since the gate stray capacitance is multiplied by the Miller effect. It will also be appreciated that high current is only found at low voltage and at that time, a fast transistor is not really necessary. Therefore in the context of the present invention, at low voltage, a huge stray capacitance is tolerable.

For high voltage, a fast MOSFET with a very low gate stray capacitance is needed. At that time, it is necessary to sacrifice the high current capabilities and trade it for a low gate stray capacitance MOSFET. At high voltage, the generated pulse width is very narrow (may be less than 10 ns). As a result the MOSFET gate needs to be charged and discharged very quickly.

Figure 20:
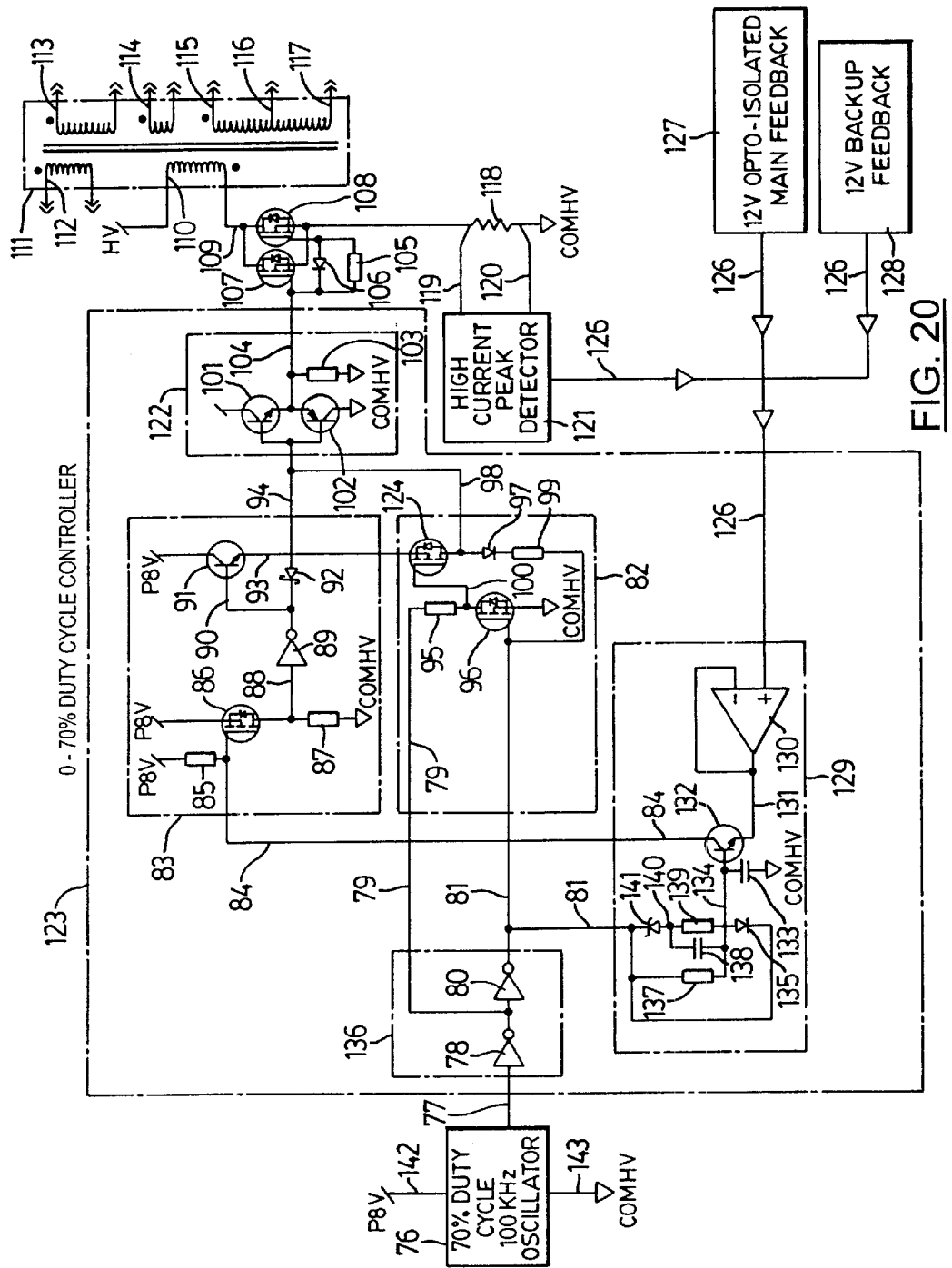
FIG. 20 is a schematic showing the duty cycle controller for the power supply.

As will be appreciated, it is difficult to find a good compromise to reduce the thermal losses. According to another aspect of the present invention, the single MOSFET 19 (FIG. 1) is replaced by the of MOSFET transistors 107 and 108 as shown in FIG. 20 described below. The sources of the two MOSFETs 107, 108 are tied together and the drains are also tied together as shown. The gates of the MOSFETs 107, 108 are coupled together via a resistor 105 and a fast recovery diode 106 as also shown in FIG. 20.

Reference is next made to FIGS. 20 and 21 which are schematic diagrams showing an implementation for the power supply circuit 1 according to the present invention.

Referring to FIG. 20, at low voltage, the pulse generated on output line 104 is quite large. The current slowly ramps up linearly through the primary winding (indicated by reference 110) of the transformer indicated by reference 111 in FIG. 20. This means that in the first few microseconds, the current through the drains of the MOSFETs 107, 108 is small. The gate of the MOSFET 108 has plenty of time to charge up and when the current becomes high through the drains, the two MOSFET transistors 107,108 are really in parallel. The MOSFETs 107, 108 evenly share the current and thereby reduce the thermal losses due to high current. The diode 106 discharges quickly the gates of the two MOSFETs 107, 108 at the same time.

At high voltage, the gate of the MOSFET 108 cannot charge enough to turn on properly the MOSFET. As the major stray capacitance is due to the Miller effect, the total stray capacitance viewed from the drain is half the value of what it would have been if the two MOSFET transistors were connected in parallel. Therefore, the equivalent of a high frequency MOSFET transistor with a low high frequency loss is obtained.

With this arrangement, the desirable characteristics of a high frequency MOSFET transistor and the desirable characteristics of a low impedance, high current capabilities MOSFET transistor are achieved.

In order to obtain a large input voltage range, fast circuitry for implementation of the controller 16 is preferred. Most modern ICs utilize TTL or CMOS technologies, and the push-pull configuration is one of the fastest configurations. Each transition consumes a lot of current since for a brief moment, since two transistors are making a short circuit between the Vcc and the ground as will be understood to those skilled in the art. If just one transistor is used and a resistor as pull-up or pull-down, one fast edge is obtained, but a very slow complementary one. The peak current is reduced considerably, but the average current is increased. With just a transistor-resistor combination, it would be impossible to create a 10 ns pulse width, But if there are two waveforms (one with fast rise time and a falling time and another one with a slow rise time and a fast falling time) a very narrow pulse could be created by shifting one waveform in reference to the other. The two waveforms are inputted to an AND gate circuit and a variable duty cycle square wave (with sharp edges) is created. Of course, the AND gate circuit must be able to switch quickly.

Figure 19:
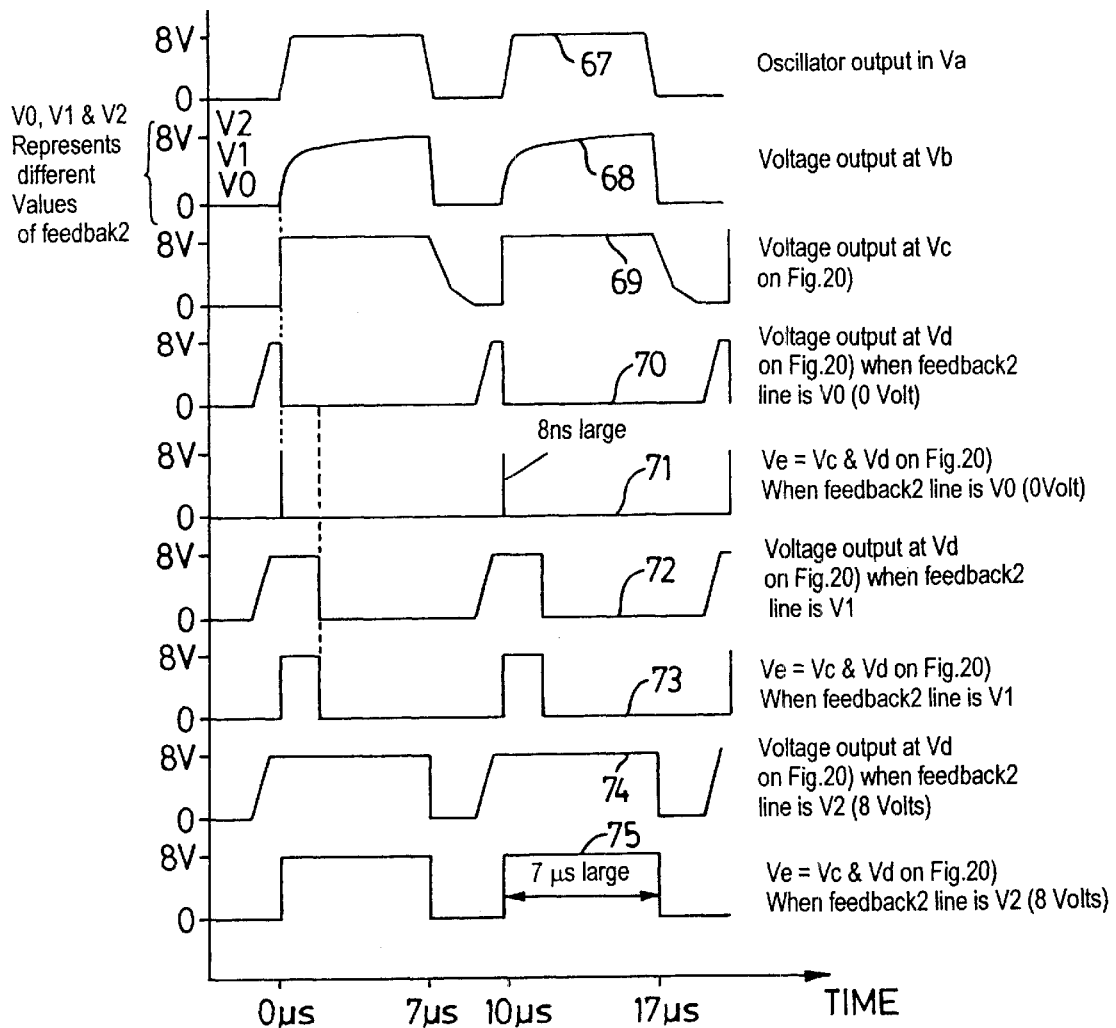
FIG. 19 is a timing diagram for the oscillator and duty cycle controller.

As shown for the implementation in FIG. 20, a 70% duty cycle 100 kHz oscillator 76 is provided. The oscillator 76 generates a waveform 67 as illustrated in FIG. 19. The duty cycle of the oscillator 76 imposes the maximum limit of the final duty cycle at the output 104. Accordingly, the condition where the two MOSFET transistors 107, 108 would be on all the time, thereby making a short circuit, is blocked.

The output 77 of the oscillator 76 passes through a circuit stage 136 comprising two inverter gates 78, 80. The two inverters 78, 80 provide respective complementary signals on respective output lines 79 and 81.

The outputs from the inverters 78, 80 feed into a circuit 82. The circuit 82 comprises two MOSFET transistors 95 and 124 and generates a fixed duty-cycle waveform 69 (FIG. 19) with a very quick rise time (less than 4 ns) and a slow fall time as illustrated in FIG. 19.

As shown in FIG. 20, the implementation includes a circuit 83 which generates a variable duty-cycle waveform with a slow rise time and a very fast fall time (less than 4 ns).

As shown in FIG. 19, the variable duty-cycle waveform slowly ramps up 70 or 72 or 74 before the fixed duty-cycle waveform 69 and very quickly falls when the fixed duty-cycle waveform 69 is still at a high level. The circuit 83 provides for a very narrow pulse 70 of 8 ns or a wide pulse 73, 75 with very sharp edges.

Referring to FIG. 20, a circuit 129 is provided to generate a variable duty cycle waveform that is controlled by a feedback signal 126. The circuit 129 includes a capacitor 133 which is charged and discharged to obtain a waveform 68 (FIG. 19) on input line 134. As soon as the voltage across the capacitor 133 reaches a level determined by the feedback input 126, transistor 132 is turned on. Depending on the Feedback2 level signal on line 126, the pulse width will vary. The pulse width is approximately 8 ns when the Feedback2 signal is 0 Volts and the pulse width is around 7 $\mu$s when the Feedback2 signal is 8 Volts.

As shown in FIG. 20, the circuit stage 83 includes a transistor 91 connected in series with the MOSFET 124 to form a logical AND gate circuit. The AND gate circuit has a very quick rise time since the transistor 91 is already on when the MOSFET124 turns on. The AND gate circuit also has a very quick falling time since the transistor 91 is configured as a follower and therefore has almost no stray capacitance to discharge. By including a Schottky diode 92, the output 94 from the circuit stage 83 is also forced to fall down very quickly. The circuit 83 includes an inverter gate 89 which is formed from four gates placed in parallel to provide increased drive capability (see FIG. 21).

It will be appreciated that the circuit stage 122 also provides a fast and powerful buffer function. The circuit 122 functions to rapidly charge up and discharges the gates of the two MOSFET transistors 107, 108.

For safety, any over current spikes are detected by a low impedance 4-wire resistor which is made as a track on the multi-layer PCB. If current above a certain threshold was detected, the circuitry for the power supply 1 is shut down by reducing the Feedback2 level signal on line 126 to the minimum, i.e. 0 Volt. After a predetermined time, e.g. fraction of second, the Feedback2 level signal is authorized to rise again. If another over current condition is detected, then the power supply circuit is again shut down. It will be appreciated even if a fault condition is maintained, and even if the power supply tries to restart every second, the energy involved is very low and nothing that would damage the power supply should occur.

Figure 18:
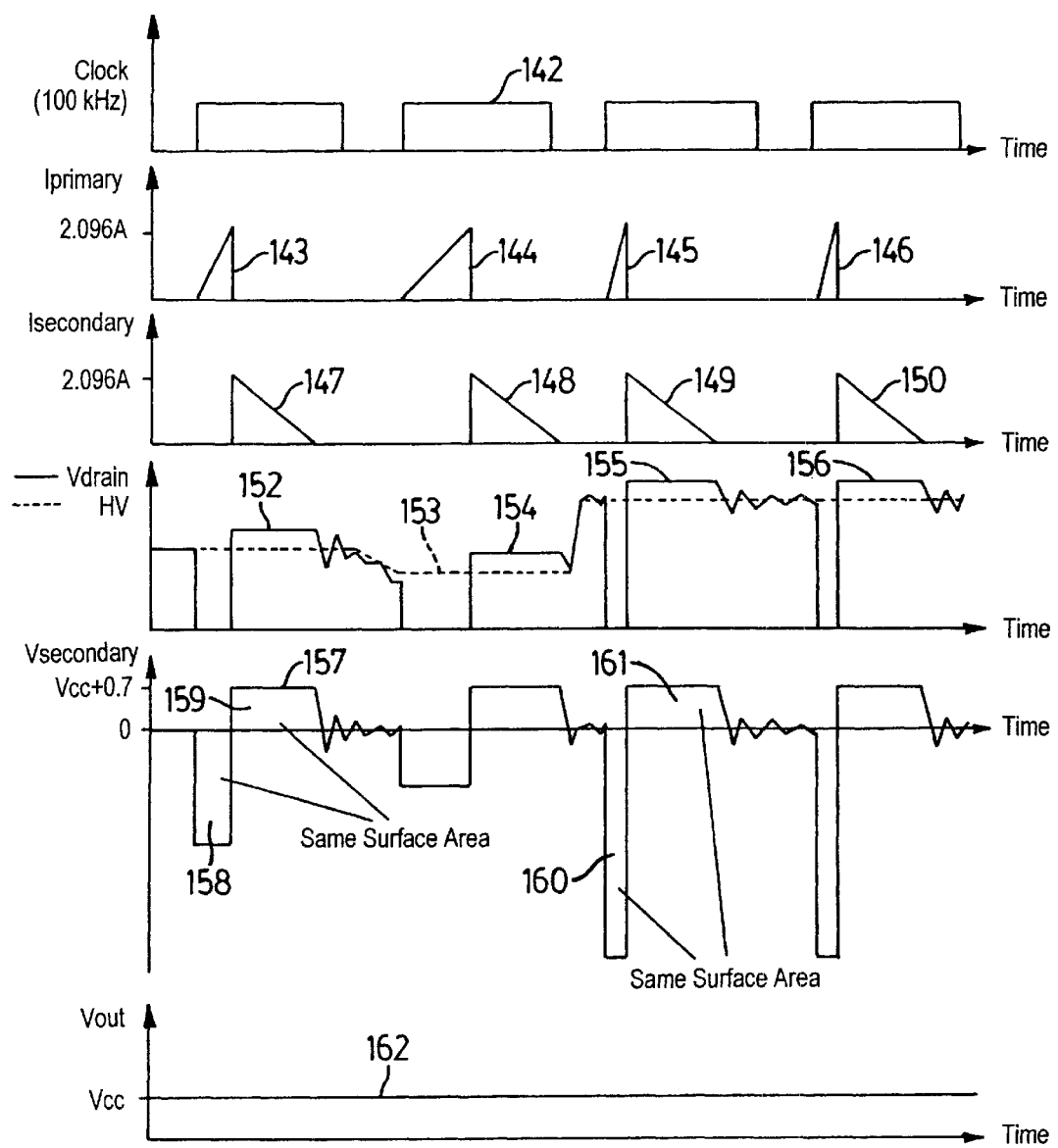
FIG. 18 is a general timing diagram for selected signals in the intrinsically safe universal switching power supply according to the present invention.

Reference is next made to FIG. 18 which shows other timing signals. The waveform generated at the transformer output takes the form of signal 157. The upper half 161 of the waveform signal 157 has the same height but the bottom half 160 is able to go very low in negative voltage. The rectifiers keep only the upper side of this waveform and with capacitors, the output voltage waveforms 162 are filtered. Each output has its own voltage and are represented by Vcc in FIG. 18.

FIG. 21 provides a schematic diagram of the implementation for the power supply circuit.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims, rather than the foregoing description, and all changes which come within the meaning and range of equivalency of the claims are therefore intended to be embraced therein.

What is claimed is:

1. A switching power supply for generating one or more voltage outputs, and one of the voltage outputs comprising an intrinsically safe voltage output, said switching power supply comprising:

(a) an input stage having an input for receiving a supply voltage and a circuit for converting said voltage to a DC level;

(b) a first stage coupled to said input stage for receiving said DC level and said first stage having a circuit for generating an output voltage from said DC level;

(c) a second stage coupled to said first stage and having a circuit for receiving said output voltage produced by said first stage and including circuitry for generating one or more voltage outputs and an intrinsically safe voltage output;

(d) a planar core transformer for isolating said second stage from said first stage;

(e) said first stage including primary windings electromagnetically coupled to said planar core transformer, and said primary windings comprising a plurality of conductive tracks formed on a layer of a multi-layer circuit board;

(f) said second stage including secondary windings electromagnetically coupled to said planar core transformer, and said secondary windings comprising a plurality of conductive tracks formed on another layer of said multi-layer circuit board, and said secondary windings including windings formed as a plurality of conductive tracks for generating said intrinsically safe voltage output, and said other layer being isolated from said layer carrying said conductive tracks for said primary windings.

2. The switching power supply as claimed in claim 1, wherein said circuit for generating an output voltage in said first stage includes a switching device and a controller coupled to said switching device, said switching device being coupled to said primary windings, and said switching device switching a current through said primary windings under the control of said controller.

3. The switching power supply as claimed in claim 2, wherein said circuit for generating an output voltage in said first stage includes an oscillator, said oscillator providing a high frequency input signal to said controller, and said controller including circuitry for generating a switching control signal having a variable duty cycle for controlling the switching of said switching device.

4. The switching power supply as claimed in claim 3, wherein said circuit for generating an output voltage in said first stage includes a start-up circuit, said start-up circuit generating an output signal for controlling operation of said controller during a start-up condition.

5. The switching power supply as claimed in claim 4, wherein said start-up circuit includes circuitry for controlling operation of said controller after the start-up condition.

6. The switching power supply as claimed in claim 4, wherein said start-up circuit comprises a voltage regulator circuit.

7. The switching power supply as claimed in claim 3, wherein said switching device comprises a MOSFET transistor.

8. The switching power supply as claimed in claim 3, wherein said switching device comprises a resistor, a diode and first and second MOSFET transistors, each one of said MOSFET transistors having a gate, source, and drain, the sources of said MOSFET transistors are connected, and the drains of said MOSFET transistors are connected, the gates of said MOSFET transistors are coupled to said diode and said diode and form an input port coupled to said controller.

9. An intrinsically safe switching power supply for generating one or more voltage outputs, said switching power supply comprising:

(a) a circuit board having a plurality of layers, and including an opening for receiving a transformer;

(b) a first stage having an input for receiving a supply voltage and including a converter circuit for converting said supply voltage to a DC level and having circuitry for producing an output voltage from said DC level, and said first stage including primary windings, said primary windings being formed as conductive tracking on one layer of said circuit board;

(c) a second stage coupled to said first stage through said transformer and said second stage including secondary windings for coupling said output voltage produced by said first stage through said transformer, said second stage including circuitry for generating one or more voltage outputs, and said secondary windings being formed as conductive tracking on another layer of said circuit board, and said circuit board including an output layer for said voltage outputs;

(d) said second stage including a sub-stage for generating an intrinsically safe voltage output, and said sub-stage comprising a plurality of separate secondary windings for coupling said output voltage produced by said first stage and circuitry for generating said intrinsically safe voltage output, and said separate secondary windings comprising conductive tracking formed on another layer of said circuit board, and said layer carrying the conductive tracking for said intrinsically safe voltage output being isolated from said other layers in said circuit board.

10. The intrinsically safe switching power supply as claimed in claim 9, wherein said transformer stage comprises a planar core transformer, and said circuit board comprises a multi-layer printed circuit board, wherein said conductive tracking comprises electrically conductive printed circuit tracks.

11. The intrinsically safe switching power supply as claimed in claim 9, wherein said circuit board includes a shield layer for shielding said layer carrying the secondary windings for said intrinsically safe voltage output, said shield layer being situated between said output layer and said layer carrying the secondary windings for said intrinsically safe voltage output.

12. The intrinsically safe switching power supply as claimed in claim 11, wherein said circuit board includes a ground layer for reducing stray capacitance, said ground layer being situated between the layer carrying said primary windings and the layers carrying said secondary windings.

13. A switching power supply for generating one or more voltage outputs, and one of the voltage outputs comprising an intrinsically safe voltage output, said switching power supply comprising:

(a) an input stage having an input stage for receiving a supply voltage and a circuit for converting said supply voltage a DC level input;

(b) a first stage coupled to said input stage for receiving said DC level and said first stage having first stage circuit for producing an output voltage from said DC level;

(c) a second stage coupled to said first stage and having a circuit for receiving said output voltage produced by said first stage and including a circuit for generating one or more voltage outputs and an intrinsically safe voltage output;

(d) a planar core transformer for isolating said second stage from said first stage;

(e) said first stage including primary windings electromagnetically coupled to said planar core transformer, and said primary windings comprising a plurality of conductive tracks formed on one layer in a multi-layer circuit board;

(f) said second stage including secondary windings electromagnetically coupled to said planar core transformer, and said secondary windings comprising a plurality of conductive tracks formed on one or more layers in the multi-layer circuit board;

(g) a start-up stage coupled to said first stage and said input stage, said start-up stage including circuitry for starting said power supply during a low period.

14. The switching power supply as claimed in claim 13, wherein said first stage circuitry includes a switching device and a controller coupled to said switching device, said switching device being coupled to said primary windings, and said switching device switching a current through said primary windings in response to an output control signal from said controller.

15. The switching power supply as claimed in claim 14, wherein said controller includes an oscillator, said oscillator providing a high frequency input signal to said controller, and said controller including circuitry for generating a variable duty cycle for said output control signal for controlling the switching of said switching device.

16. The switching power supply as claimed in claim 15, wherein said switching device comprises a MOSFET transistor.

17. The switching power supply as claimed in claim 15, wherein said switching device comprises a resistor, a diode and first and second MOSFET transistors, each one of said MOSFET transistors having a gate, source, and drain, the sources of said MOSFET transistors are connected, and the drains of said MOSFET transistors are connected, the gates of said MOSFET transistors are coupled to said diode and said diode and form an input port coupled to said controller.

18. A switching power supply for generating one or more voltage outputs, said switching power supply comprising.

(a) an input stage having an input for receiving a supply voltage and a circuit for converting said voltage to a DC level;

(b) a first stage coupled to said input stage for receiving said DC level and said first stage having a circuit for generating an output voltage from said DC level;

(c) a second stage coupled to said first stage and having a circuit for receiving said output voltage produced by said first stage and including circuitry for generating one or more voltage outputs and an intrinsically safe voltage output;

(d) a planar core transformer for isolating said second stage from said first stage;

(e) said first stage including primary windings electromagnetically coupled to said planar core transformer, and said primary windings comprising a plurality of conductive tracks formed on a layer of a multi-layer circuit board;

(f) said second stage including secondary windings electromagnetically coupled to said planar core transformer, and said secondary windings comprising a plurality of conductive tracks formed on another layer of said multi-layer circuit board, and said other layer being isolated from said layer carrying said conductive tracks for said primary windings;

(g) said circuit for generating an output voltage in said first stage including a switching device and a controller coupled to said switching device, said switching device being coupled to said primary windings, and said switching device switching a current through said primary windings under the control of said controller.

19. The switching power supply as claimed in claim 18, wherein said circuit for generating an output voltage in said first stage includes an oscillator, said oscillator providing a high frequency input signal to said controller, and said controller including circuitry for generating a switching control signal having a variable duty cycle for controlling the switching of said switching device.

20. The switching power supply as claimed in claim 19, wherein said circuit for generating an output voltage in said first stage includes a start-up circuit, said start-up circuit generating an output signal for controlling operation of said controller during a start-up condition.

21. The switching power supply as claimed in claim 20, wherein said start-up circuit comprises a voltage regulator circuit.

22. The switching power supply as claimed in claim 19, wherein said switching device comprises a resistor, a diode and first and second MOSFET transistors, each one of said MOSFET transistors having a gate, source, and drain, the sources of said MOSFET transistors are connected, and the drains of said MOSFET transistors are connected, the gates of said MOSFET transistors are coupled to said diode and said diode and form an input port coupled to said controller.

* * * * *

UNITED STATES PATENT AND TRADEMARK OFFICE
CERTIFICATE OF CORRECTION

PATENT NO.    : 6,590,788 B2
DATED         : July 8, 2003
INVENTOR(S)   : Claude Mercier It is certified that error appears in the above-identified patent and that said Letters Patent is hereby corrected as shown below:

<u>Title page,</u>
Item [73], Assignee, change "Milltronics, Ltd." to -- Siemens Milltronics Process Instruments, Inc. --

Signed and Sealed this

Eleventh Day of November, 2003

JAMES E. ROGAN
*Director of the United States Patent and Trademark Office*